United States Patent
Pahk et al.

(10) Patent No.: US 12,501,778 B2
(45) Date of Patent: Dec. 16, 2025

(54) DISPLAY DEVICE AND METHOD OF MANUFACTURING THE SAME

(71) Applicant: Samsung Display Co., Ltd., Yongin-Si (KR)

(72) Inventors: Jaebum Pahk, Yongin-si (KR); Donggyu Shin, Yongin-si (KR); Bongjin Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 513 days.

(21) Appl. No.: 16/811,365

(22) Filed: Mar. 6, 2020

(65) Prior Publication Data

US 2021/0057498 A1    Feb. 25, 2021

(30) Foreign Application Priority Data

Aug. 22, 2019   (KR) .......................... 10-2019-0103306

(51) Int. Cl.
*H10K 59/122* (2023.01)
*H10K 59/123* (2023.01)
(Continued)

(52) U.S. Cl.
CPC ......... *H10K 59/122* (2023.02); *H10K 59/123* (2023.02); *H10K 59/8731* (2023.02); *H10K 59/1201* (2023.02); *H10K 59/8791* (2023.02)

(58) Field of Classification Search
CPC ............. H01L 2227/323; H01L 27/322; H01L 27/323; H01L 27/3246; H01L 27/3248;
(Continued)

(56) References Cited

U.S. PATENT DOCUMENTS

| | | |
|---|---|---|
| 7,932,518 B2 | 4/2011 | Seki et al. |
| 8,389,323 B2 | 3/2013 | Choi et al. |

(Continued)

FOREIGN PATENT DOCUMENTS

| | | |
|---|---|---|
| CN | 103715223 A | 4/2014 |
| CN | 107658386 A | 2/2018 |

(Continued)

OTHER PUBLICATIONS

V Zorba, L Persano, D Pisignano, A Athanassiou, E Stratakis, R Cingolani, P Tzanetakis and C Fotakis, "Making silicon hydrophobic: wettability control by two-lengthscale simultaneous patterning with femtosecond laser irradiation", Institute of Physics Publishing, Nanotechnology 17 (2006) 3234-3238 (5pages), Online at stacks.iop.org/Nano/17/3234, Published Jun. 7, 2006, 7 pages, © 2006 IOP Publishing Ltd Printed in the UK doi:10.1088/0957-4484/17/13/026.

*Primary Examiner* — Meiya Li
(74) *Attorney, Agent, or Firm* — Innovation Counsel LLP

(57) ABSTRACT

A display device includes: a substrate including a display area and a non-display area; a plurality of display elements disposed in the display area and including a pixel electrode, a common layer, a light-emitting layer, and an opposite electrode; and a pixel defining layer having an opening exposing a central portion of the pixel electrode, wherein the common layer includes a first region disposed between a first light-emitting layer disposed in a first display element and a second light-emitting layer disposed in a second display element adjacent to the first display element among the plurality of display elements, and wherein the first region has protrusions spaced apart from one another.

12 Claims, 19 Drawing Sheets

(51) Int. Cl.
  *H10K 59/80* (2023.01)
  *H10K 59/12* (2023.01)

(58) Field of Classification Search
  CPC ............. H01L 51/0012; H01L 51/5256; H01L 51/5259; H01L 51/5281; H01L 51/56; H10K 50/8445; H10K 50/846; H10K 50/86; H10K 59/1201; H10K 59/122; H10K 59/123; H10K 59/38; H10K 59/40; H10K 71/00; H10K 71/191; H10K 59/8731; H10K 59/8791
  See application file for complete search history.

(56) References Cited

U.S. PATENT DOCUMENTS

| | | |
|---|---|---|
| 8,809,079 B2 | 8/2014 | Chen et al. |
| 9,570,708 B2 | 2/2017 | Kim et al. |
| 9,735,223 B2 | 8/2017 | Oh et al. |
| 2003/0156079 A1 | 8/2003 | Nakanishi |
| 2010/0052519 A1 | 3/2010 | Jeon et al. |
| 2012/0319089 A1* | 12/2012 | Shin .................. H01L 51/0017 257/E51.024 |
| 2014/0084257 A1 | 3/2014 | Kim et al. |
| 2014/0097420 A1 | 4/2014 | Lee et al. |
| 2015/0069361 A1* | 3/2015 | Sato .................... H01L 51/0015 438/34 |
| 2016/0284770 A1 | 9/2016 | Kim |
| 2016/0285038 A1 | 9/2016 | Kim et al. |
| 2018/0026225 A1 | 1/2018 | Kwon et al. |
| 2018/0026226 A1 | 1/2018 | Choi et al. |
| 2019/0131379 A1 | 5/2019 | Won et al. |
| 2019/0207140 A1 | 7/2019 | Lee et al. |

FOREIGN PATENT DOCUMENTS

| | | |
|---|---|---|
| JP | 4196410 B2 | 12/2008 |
| KR | 1020100025828 A | 3/2010 |
| KR | 10-0976864 B1 | 8/2010 |
| KR | 10-1213491 B1 | 12/2012 |
| KR | 1020130000308 A | 1/2013 |
| KR | 1020140038827 A | 3/2014 |
| KR | 10-2015-0014207 A | 2/2015 |
| KR | 10-1641207 B1 | 7/2016 |
| KR | 1020160114220 A | 10/2016 |
| KR | 1020180009845 A | 1/2018 |
| KR | 10-2019-0048784 A | 5/2019 |
| KR | 1020190081213 A | 7/2019 |

* cited by examiner

DISPLAY DEVICE AND METHOD OF MANUFACTURING THE SAME

CROSS-REFERENCE TO RELATED APPLICATION

This application claims the benefit of Korean Patent Application No. 10-2019-0103306, filed on Aug. 22, 2019, in the Korean Intellectual Property Office, the disclosure of which is incorporated herein in its entirety by reference.

BACKGROUND

1. Field

One or more embodiments relate to a display device and a method of manufacturing the display device.

2. Description of Related Art

As the information society develops, the demand for display devices for displaying images in various forms has increased. The field of display devices has rapidly changed to thin, light and large-area flat panel display devices (FPDs) which replace bulky cathode ray tubes (CRTs). A flat panel display device includes a liquid crystal display (LCD), a plasma display panel (PDP), an organic light-emitting display (OLED), and an electrophoretic display (EPD).

Among the display devices, the OLED includes an organic light-emitting diode including a pixel electrode, an opposite electrode, and a light-emitting layer disposed between the pixel electrode and the opposite electrode. When voltage is applied to the opposite electrode and the pixel electrode of the organic light-emitting diode, visible light is emitted from the light-emitting layer.

An organic light-emitting display device may include organic light-emitting diodes that emit red, green, and blue visible lights to implement a color screen, and a light-emitting layer of each of the organic light-emitting diodes may be formed using an inkjet printing method or the like.

The display device includes a display area for displaying an image and a non-display area other than the display area through which the image is not displayed. Recently, studies are being actively conducted to increase the display area by reducing the area of the non-display area in which signal lines and the like of the display device are arranged.

SUMMARY

One or more embodiments include a display device in which a light-emitting layer disposed on each of organic light-emitting diodes may be easily formed, and a method of manufacturing the display device.

In addition, one or more embodiments include a display device with a reduced area of a non-display area, and a method of manufacturing the display device.

Additional aspects will be set forth in part in the description which follows and, in part, will be apparent from the description, or may be learned by practice of the presented embodiments of the disclosure.

According to one or more embodiments, a display device includes a substrate including a display area and a non-display area; a plurality of display elements disposed in the display area and including a pixel electrode, a common layer, a light-emitting layer, and an opposite electrode and a pixel defining layer having an opening exposing a central portion of the pixel electrode, wherein the common layer comprises a first region disposed between a first light-emitting layer disposed in a first display element and a second light-emitting layer disposed in a second display element adjacent to the first display element among the plurality of display elements, and wherein the first region has protrusions spaced apart from one another.

In an embodiment, an upper surface of the light-emitting layer may be parallel to an upper surface of the substrate.

In an embodiment, the light-emitting layer may be disposed between the opposite electrode and the common layer, and may extend from a central portion of the pixel electrode to at least a portion of an inner surface of the opening.

In an embodiment, the upper surface of the light-emitting layer may be convex.

In an embodiment, a width of a second region of the common layer in which the light-emitting layer is disposed may be less than a width of the opening exposed by the pixel defining layer.

In an embodiment, the first region may extend to the inner surface of the opening.

In an embodiment, the light-emitting layer may be disposed between the common layer and the opposite electrode in the opening.

In an embodiment, in the first region, the common layer may include a lower region to which each of the protrusions are connected.

In an embodiment, at least one of the protrusions may have a rectangular cross-sectional shape.

In an embodiment, the width of at least one of the protrusions at a first point may be less than the width the at least one of the protrusions at a second point closer to the lower region than the first point in a thickness direction.

In an embodiment, intervals at which the protrusions are spaced apart from each other may be about 1 μm or more and about 30 μm or less.

In an embodiment, the display device includes a second region in which the light-emitting layer overlaps the common layer, wherein the at least one of first region and second region is a hydrophobic region, and the other may be a hydrophilic region.

According to one or more embodiments, a display device includes a substrate including a display area for displaying an image and a non-display area surrounding the display area, a pixel circuit layer comprising a thin film transistor, a display element including a pixel electrode, a light-emitting layer, and an opposite electrode connected to the thin film transistor on the display area, and a first inorganic encapsulation layer, an organic encapsulation layer, and a second inorganic encapsulation layer disposed on the display element, wherein the first inorganic encapsulation layer includes a boundary portion including protrusions spaced apart from each other on the non-display area, the boundary portion surrounds the display area, and the organic encapsulation layer is disposed not to overlap the boundary portion.

In an embodiment, the second inorganic encapsulation layer may contact the first inorganic encapsulation layer at the boundary portion.

In an embodiment, the first inorganic encapsulation layer at the boundary may include a lower region to which the protrusions are connected.

In an embodiment, the protrusions may have rectangular cross-sectional shapes in the first inorganic encapsulation layer at the boundary portion.

In an embodiment, the width of at least one of the protrusions at a first point may be less than the width of the at least one of the protrusions at a second point closer to the lower region than the first point in a thickness direction.

In an embodiment, the first inorganic encapsulation layer includes an inner portion disposed inside of the inner boundary of the boundary portion, and wherein at least one of the boundary portion and the inner portion may be a hydrophilic region, and the other may be a hydrophobic region.

According to one or more embodiments, a method of manufacturing a display device includes preparing a substrate including a display area and a non-display area, forming display elements on the display area, forming a first inorganic encapsulation layer on the display element; forming a boundary portion including protrusions spaced apart from each other on the first inorganic encapsulation layer disposed on the non-display area, forming an organic encapsulation layer on the first inorganic encapsulation layer inside of an inner boundary of the boundary portion and forming a second inorganic encapsulation layer on the organic encapsulation layer and the boundary portion.

In an embodiment, the second inorganic encapsulation layer may be in contact with the first inorganic encapsulation layer at the boundary portion.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
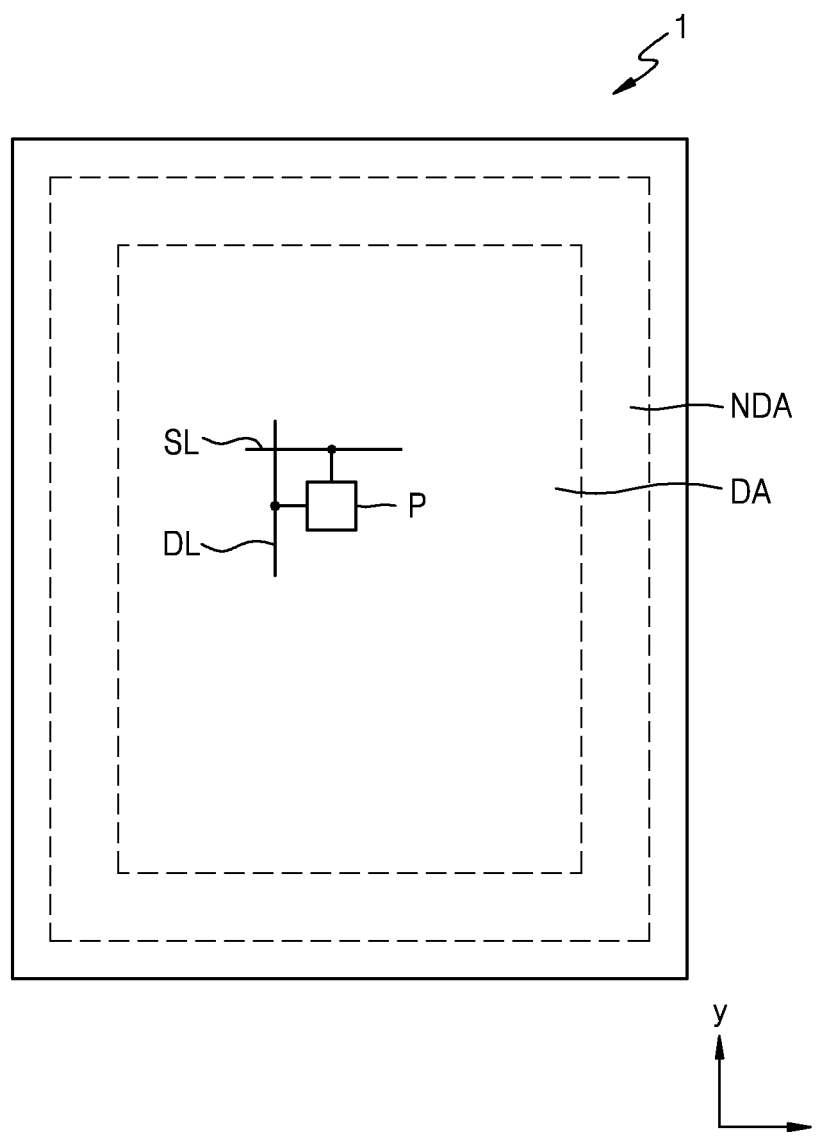
FIG. 1 is a plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the disclosure will be described in detail with reference to the accompanying drawings. The same reference numerals are used to denote the same elements, and repeated descriptions thereof will be omitted.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

FIG. 1 is a plan view of a display device according to an embodiment.

Referring to FIG. 1, a display device 1 has a display area DA displaying a certain image and a non-display area NDA surrounding the display area DA.

The display device 1 is a device for displaying an image, and may be a portable mobile device such as a mobile phone, a game machine, a multimedia device, or a micro PC.

A plurality of pixels P may be disposed in the display area DA. The plurality of pixels P disposed in the display area DA may emit red, green, or blue light and the display area DA may provide a certain image by using light emitted from the pixels P.

The pixels P may be electrically connected to a scan line SL extending in a first direction (e.g., an x direction) and a data line DL extending in a second direction (e.g., a y direction).

Figure 2A:
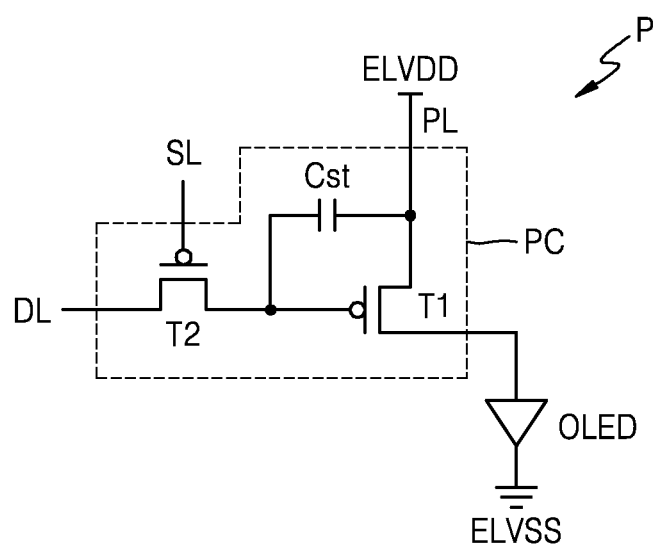
FIGS. 2A and 2B are equivalent circuit diagrams of a pixel in a display device according to an embodiment.
Figure 2B:
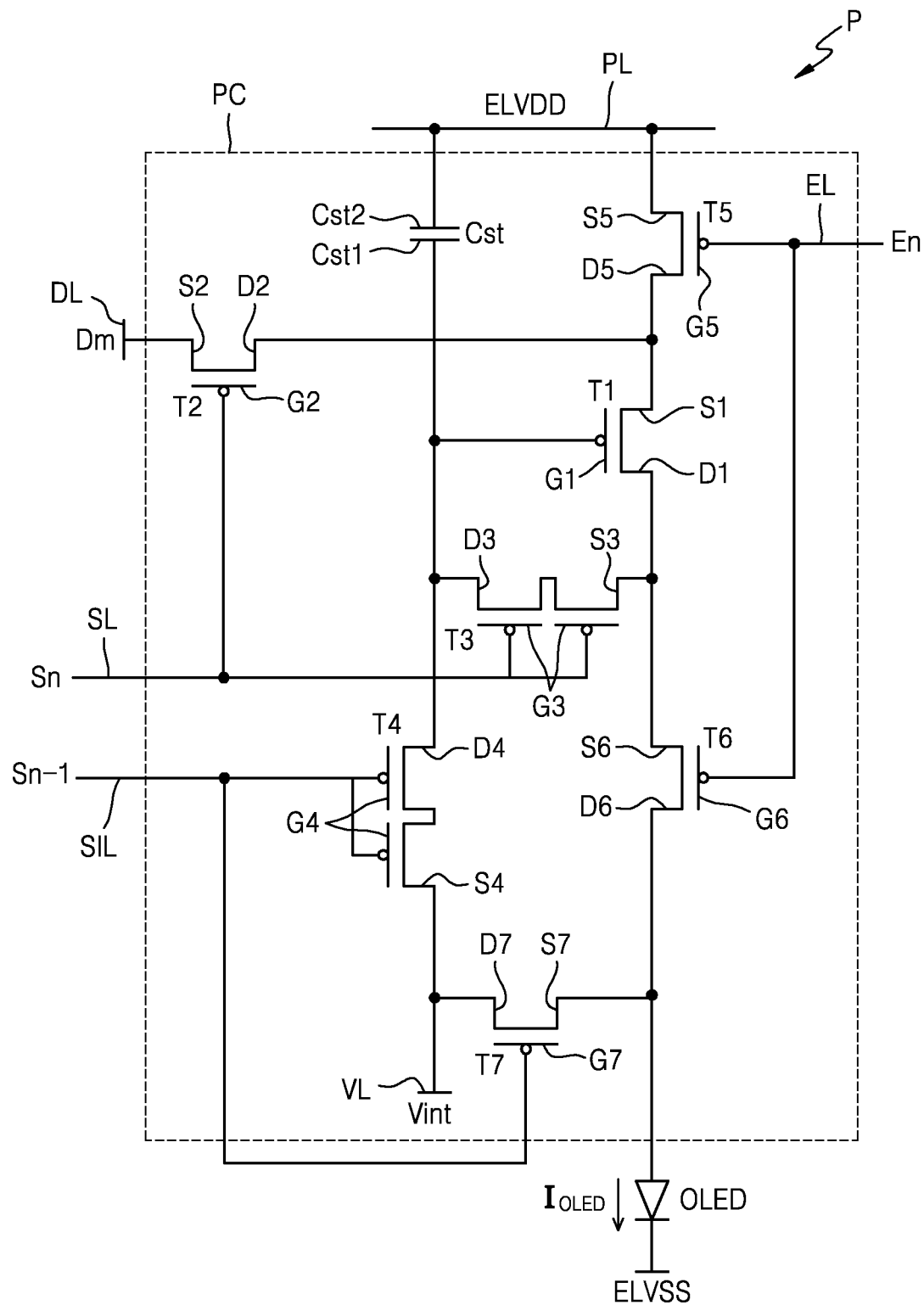

FIGS. 2A and 2B are equivalent circuit diagrams of one of the pixels P in the display device 1 according to an embodiment.

Referring to FIG. 2A, the pixel P may include the pixel circuit PC and the organic light-emitting diode OLED as a display element connected to the pixel circuit PC.

The pixel circuit PC may include a driving thin-film transistor T1, a switching thin-film transistor T2, and a storage capacitor Cst. Each pixel P may emit, for example, red, green, or blue light from the organic light-emitting diode OLED. Alternatively, each pixel P may emit, for example, red, green, blue, or white light from the organic light-emitting diode OLED.

The switching thin-film transistor T2 is connected to the scan line SL and the data line DL and may transfer a data voltage input from the data line DL to the driving thin-film transistor T1 in response to a switching voltage input from the scan line SL. A storage capacitor Cst is connected between the switching thin-film transistor T2 and a driving voltage line PL, and may store a voltage corresponding to a difference between a voltage received from the second thin-film transistor T2 and a first power supply voltage ELVDD supplied to the driving voltage line PL.

The driving thin-film transistor T1 is connected between the driving voltage line PL to which one node of the storage capacitor is connected and the organic light-emitting diode OLED. The driving thin-film transistor T1 may control a driving current flowing through the organic light-emitting diode OLED. The driving current flowing through the organic light-emitting diode OLED may correspond to a voltage stored in the storage capacitor Cst. The organic light-emitting diode OLED may emit light having certain luminance according to the driving current. An opposite electrode (e.g., cathode) of the organic light-emitting diode OLED may be supplied with a second power supply voltage ELVSS.

Although FIG. 2A illustrates that the pixel circuit PC includes two thin-film transistors and one storage capacitor, in some embodiments, the number of thin-film transistors and the number of storage capacitors may vary according to the design of the pixel circuit PC. For example, the pixel circuit PC may further include one or more thin film transistors in addition to the aforementioned two thin film transistors.

Referring to FIG. 2B, the pixel circuit PC may include a plurality of thin film transistors and a storage capacitor. The thin film transistors and the storage capacitor may be connected to signal lines SL, SIL, EL, and DL, an initialization voltage line VL, and the driving voltage line PL.

In FIG. 2B, each pixel P is connected to the signal lines SL, SIL, EL, and DL, the initialization voltage line VL, and the driving voltage line PL. However, in another embodiment, at least one of the signal lines SL, SIL, EL, and DL, the initialization voltage line VL, the driving voltage line PL, and the like may be shared by neighboring pixels.

The plurality of thin-film transistors may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

A signal line includes the scan line SL for transmitting a scan signal Sn, a previous scan line SIL for transmitting a previous scan signal Sn-1 to the first initialization thin-film transistor T4 and the second initialization thin-film transistor T7, an emission control line EL for transmitting an emission control signal En to the operation control thin-film transistor T5 and the emission control thin-film transistor T6, and the data line DL intersecting the scan line SL for transmitting a data signal Dm. The driving voltage line PL transmits the first power supply voltage ELVDD to the driving thin-film transistor T1, and the initialization voltage line VL transmits an initialization voltage Vint for initializing the driving thin-film transistor T1 and a pixel electrode.

A driving gate electrode G1 of the driving thin-film transistor T1 is connected to a lower electrode Cst1 of the storage capacitor Cst, a driving source electrode Si of the driving thin-film transistor T1 is connected to the driving voltage line PL via the operation control thin-film transistor T5, and a driving drain electrode D1 of the driving thin-film transistor T1 is electrically connected to a pixel electrode of the organic light-emitting diode OLED via the emission control thin-film transistor T6. The driving thin-film transistor T1 receives the data signal Dm according to a switching operation of the switching thin-film transistor T2 and supplies a driving current IOLED to the organic light-emitting diode OLED.

A switching gate electrode G2 of the switching thin-film transistor T2 is connected to the scan line SL, a switching source electrode S2 of the switching thin-film transistor T2 is connected to the data line DL, and a switching drain electrode D2 of the switching thin-film transistor T2 is connected to the driving source electrode S1 of the driving thin-film transistor T1 and connected to the driving voltage line PL through the operation control thin-film transistor T5. The switching thin-film transistor T2 is turned on in response to the scan signal Sn received through the scan line SL and performs a switching operation for transmitting the data signal Dm supplied from the data line DL to the driving source electrode S1 of the driving thin-film transistor T1.

A compensation gate electrode G3 of the compensation thin-film transistor T3 is connected to the scan line SL, a compensation source electrode S3 of the compensation thin-film transistor T3 is connected to the driving drain electrode D1 of the driving thin-film transistor T1 and connected to the pixel electrode of the organic light-emitting element OLED through the emission control thin-film transistor T6, and a compensation drain electrode D3 of the compensation thin-film transistor T3 is connected to the lower electrode Cst1 of the storage capacitor Cst, a first initialization drain electrode D4 of the first initialization thin-film transistor T4, and the driving gate electrode G1 of the driving thin-film transistor T1. The compensation thin-film transistor T3 is turned on in response to the scan signal Sn received through the scan line SL and electrically connects the driving gate electrode G1 to the driving drain electrode D1 of the driving thin-film transistor T1 to diode-connect the driving thin-film transistor T1.

A first initialization gate electrode G4 of the first initialization thin-film transistor T4 is connected to the previous scan line SIL, a first initialization source electrode S4 of the first initialization thin-film transistor T4 is connected to a second initialization drain electrode D7 of the second initialization thin-film transistor T7 and the initialization voltage line VL, and the first initialization drain electrode D4 of the first initialization thin-film transistor T4 is connected to the lower electrode Cst1 of the storage capacitor Cst, the compensation drain electrode D3 of the compensation thin-film transistor T3, and the driving gate electrode G1 of the driving thin-film transistor T1. The first initialization thin-film transistor T4 is turned on in response to a previous scan signal Sn-1 received through the previous scan line SIL and initializes a voltage of the driving gate electrode G1 of the driving thin-film transistor T1 by transmitting the initialization voltage Vint to the driving gate electrode G1 of the driving thin-film transistor T1.

An operation control gate electrode G5 of the operation control thin-film transistor T5 is connected to the emission control line EL, an operation control source electrode S5 of the operation control thin-film transistor T5 is connected to the driving voltage line PL, and an operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the emission control thin-film transistor T6 is connected to the emission control line EL, an emission control source electrode S6 of the emission control thin-film transistor T6 is connected to the driving drain electrode D1 of the driving thin-film transistor T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting diode OLED.

The operation control thin-film transistor T5 and the emission control thin-film transistor T6 are simultaneously turned on in response to the emission control signal En received through the emission control line EL so that the first power supply voltage ELVDD is transmitted to the organic light-emitting diode OLED and the driving current IOLED flows through the organic light-emitting diode OLED.

A second initialization gate electrode G7 of the second initialization thin-film transistor T7 is connected to the previous scan line SIL, the second initialization source electrode S7 of the second initialization thin-film transistor T7 is connected to the emission control drain electrode D6 of the emission control thin-film transistor T6 and the pixel electrode of the organic light-emitting diode OLED, and the second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on in response to the previous scan signal Sn-1 received through the previous scan line SIL to initialize the pixel electrode of the organic light-emitting diode OLED.

Although FIG. 2B illustrates a case where the first initialization thin-film transistor T4 and the second initialization thin-film transistor T7 are connected to the previous scan line SIL, in another embodiment, the first initialization thin-film transistor T4 may be connected to the previous scan line SIL and driven according to the previous scan signal Sn-1, and the second initialization thin-film transistor T7 may be connected to a separate signal line (e.g., next scan line) and driven according to a signal transmitted to the signal line.

An upper electrode Cst2 of the storage capacitor Cst is connected to the driving voltage line PL and an opposite electrode of the organic light-emitting diode OLED is connected to the second power supply voltage ELVSS. Accordingly, the driving current IOLED of the organic light-emitting diode OLED may flow through the driving thin-film transistor T1, thus, the organic light-emitting diode OLED may emit light to display an image.

FIG. 2B shows that the compensation thin-film transistor T3 and the first initialization thin-film transistor T4 have a dual gate electrode. However, the compensation thin-film transistor T3 and the first initialization thin-film transistor T4 may have one gate electrode.

Figure 2C:
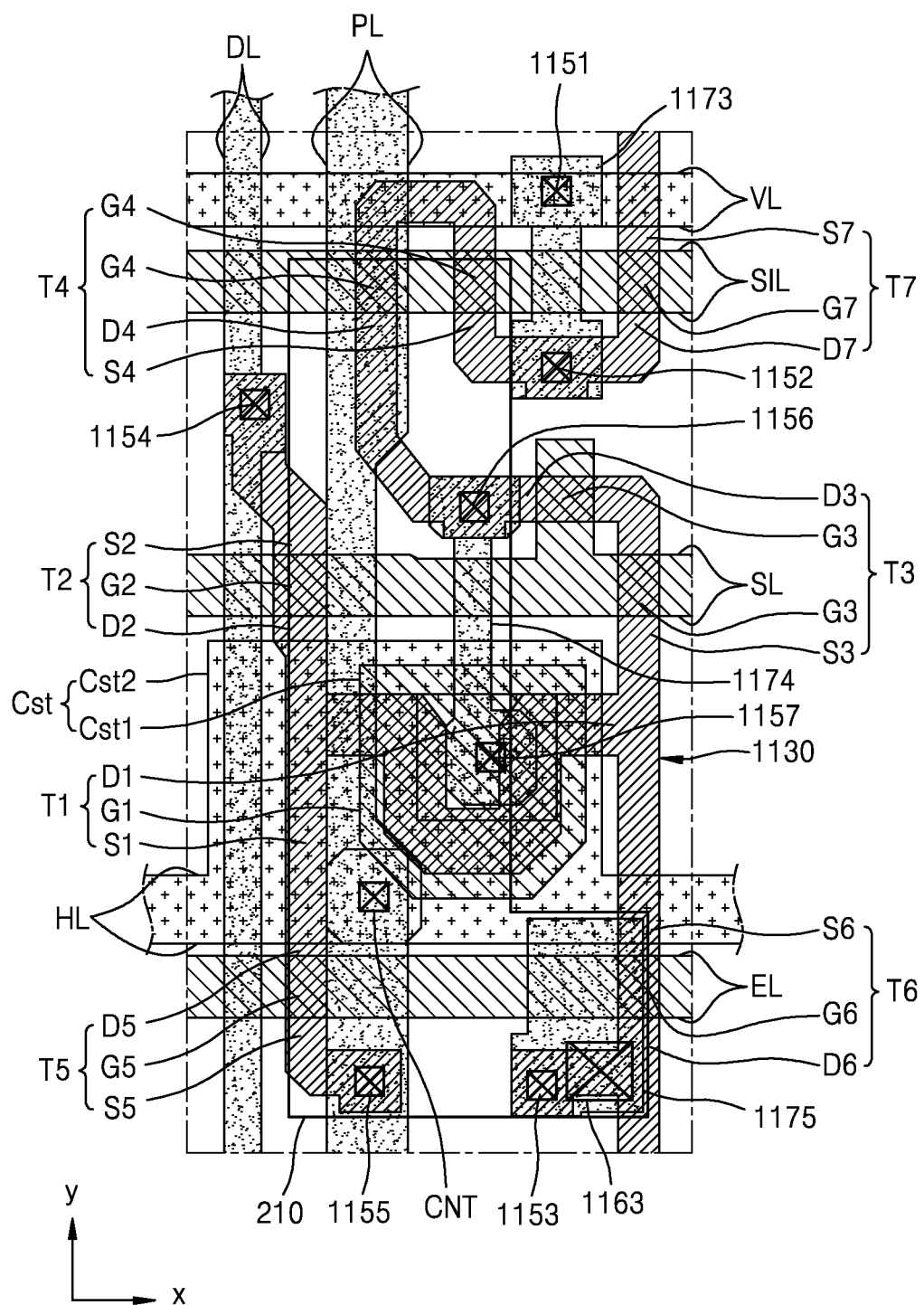
FIG. 2C is a plan view of a pixel circuit according to an embodiment.

FIG. 2C is a plan view of the pixel circuit PC according to an embodiment.

Referring to FIG. 2C, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130. The semiconductor layer 1130 is disposed on a substrate on which a buffer layer is formed, the buffer layer including an inorganic insulating material.

Some regions of the semiconductor layer 1130 may correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, it can be understood that the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are connected to each other and bent in various shapes.

The semiconductor layer 1130 includes a channel region and a source region and a drain region on both sides of the channel region, wherein the source region and the drain region are regions of the semiconductor layer 1130 to which a source electrode and a drain electrode of a corresponding thin-film transistor are connected. Hereinafter, for the sake of convenience, a source region and a drain region are referred to as a source electrode and a drain electrode, respectively.

The driving thin-film transistor T1 includes the driving gate electrode G1 overlapping a driving channel region, and the driving source electrode Si and the driving drain electrode D1 disposed on both sides of the driving channel region. The driving channel region overlapping the driving gate electrode G1 has a bent shape such as an omega shape so that a long channel length may be formed in a narrow space. When the driving channel region is long, a driving range of a gate voltage is widened, so that the gradation of light emitted from the organic light-emitting diode OLED may be more precisely controlled and display quality may be improved.

The switching thin-film transistor T2 includes the switching gate electrode G2 overlapping a switching channel region, and the switching source electrode S2 and the switching drain electrode D2 disposed on both sides of the switching channel region. The switching drain electrode D2 may be connected to the driving source electrode S1.

The compensation thin-film transistor T3 may be a dual thin-film transistor having compensation gate electrodes G3 overlapping two compensation channel regions, and may include the compensation source electrode S3 and the compensation drain electrode D3 disposed on both sides of the compensation gate electrodes G3. The compensation thin-film transistor T3 may be connected to the driving gate electrode G1 of the driving thin-film transistor T1 through a node connecting line 1174 to be described later below.

The first initialization thin-film transistor T4 may be a dual thin-film transistor having the first initialization gate electrodes G4 overlapping two first initialization channel regions, and may include the first initialization source electrode S4 and the first initialization drain electrode D4 disposed on both sides of the first initialization gate electrodes G4.

The operation control thin-film transistor T5 may include the operation control gate electrode G5 overlapping an operation control channel region, and may include the operation control source electrode S5 and the operation control drain electrode D5 disposed on both sides of the operation control gate electrode G5. The operation control drain electrode D5 may be connected to the driving source electrode S1.

The emission control thin-film transistor T6 may include the emission control gate electrode G6 overlapping an emission control channel region, and may include the emission control source electrode S6 and the emission control drain electrode D6 disposed on both sides of the emission control gate electrode G6. The emission control source electrode S6 may be connected to the driving drain electrode D1.

The second initialization thin-film transistor T7 may include the second initialization gate electrode G7 overlapping a second initialization channel region, and the second initialization source electrode S7 and the second initialization drain electrode D7 disposed on both sides of the second initialization gate electrode G7.

The aforementioned thin-film transistors may be connected to the signal lines SL, SIL, EL, and DL, the initialization voltage line VL, and the driving voltage line PL.

The scan line SL, the previous scan line SIL, the emission control line EL, and the driving gate electrode G1 may be arranged on the aforementioned semiconductor layer 1130 with insulating layer(s) disposed between signal lines such as the scan line SL, the previous scan line SIL, the emission control line EL and the driving gate electrode G1, and the semiconductor layer 1130.

The scan line SL may extend in a first direction. Some regions of the scan line SL may correspond to the switching gate electrode G2 and the compensation gate electrodes G3. For example, some regions of the scan line SL overlapping channel regions of the switching thin-film transistors T2 and the compensation thin-film transistor T3 may be the switching gate electrodes G2 and the compensation gate electrodes G3, respectively.

The previous scan line SIL may extend in the first direction, and some regions of the previous scan line SIL may correspond to the first initialization gate electrodes G4 and the second initialization gate electrode G7, respectively. For example, some regions of the previous scan line SIL overlapping channel regions of the first initialization driving thin-film transistors T4 and the second initialization driving thin-film transistor T7 may be the first initialization gate electrodes G4 and the second initialization gate electrodes G7, respectively.

The emission control line EL extends in the first direction. Some regions of the emission control line EL may correspond to the operation control gate electrodes G5 and the emission control gate electrode G6, respectively. For example, some regions of the emission control line EL overlapping channel regions of the operation control driving thin film transistors T5 and the emission control driving thin film transistors T6 may be the operation control gate electrodes G5 and the emission control gate electrode G6, respectively.

The driving gate electrode G1 may be connected to the compensation thin-film transistor T3 through the aforementioned node connecting line 1174.

An electrode voltage line HL may be disposed on the scan line SL, the previous scan line SIL, the emission control line EL, and the driving gate electrode G1 with the insulating layer(s) disposed therebetween.

The electrode voltage line HL may extend in the first direction so as to intersect the data line DL and the driving voltage line PL. A portion of the electrode voltage line HL covers at least a portion of the driving gate electrode G1 and may form the storage capacitor Cst together with the driving gate electrode G1. For example, the driving gate electrode G1 may be the lower electrode Cst1 of the storage capacitor Cst and a portion of the electrode voltage line HL may be the upper electrode Cst2 of the storage capacitor Cst.

The upper electrode CE2 of the storage capacitor Cst is electrically connected to the driving voltage line PL. In this regard, the electrode voltage line HL may be connected to the driving voltage line PL disposed on the electrode voltage line HL through a contact hole CNT. Therefore, the electrode voltage line HL may have the same voltage level (constant voltage) as that of the driving voltage line PL. For example, the electrode voltage line HL may have a constant voltage of +5 V. The electrode voltage line HL can be understood as a horizontal driving voltage line.

Since the driving voltage line PL extends in a second direction and the electrode voltage line HL electrically connected to the driving voltage line PL extends in the first direction crossing the second direction (e.g., y direction), a plurality of driving voltage lines PL and electrode voltage lines HL may form a mesh structure in a display area.

In the present embodiment, the electrode voltage line HL may be disposed on a layer different from that of the driving voltage line PL, and resistivity of the electrode voltage line HL may be greater than that of the driving voltage line PL.

The data line DL, the driving voltage line PL, an initialization connecting line 1173, and the node connecting line 1174 may be disposed on the electrode voltage line HL with insulating layer(s) disposed therebetween.

The data line DL extends in the second direction and may be connected to the switching source electrode S2 of the switching thin-film transistor T2 through a contact hole 1154. A portion of the data line DL can be understood as a switching source electrode.

The driving voltage line PL extends in the second direction and is connected to the electrode voltage line HL through the contact hole CNT as described above. Further, the driving voltage line PL may be connected to the operation control thin-film transistor T5 through a contact hole 1155. The driving voltage line PL may be connected to the operation control source electrode S5 through the contact hole 1155.

One end of the initialization connecting line 1173 may be connected to the first and second initialization thin-film transistors T4 and T7 through a contact hole 1152, and the other end may be connected to the initialization voltage line VL to be described later below through a contact hole 1151.

One end of the node connecting line 1174 may be connected to the compensation drain electrode D3 through a contact hole 1156, and the other end may be connected to the driving gate electrode G1 through a contact hole 1157.

The initialization voltage line VL may be disposed on the data line DL, the driving voltage line PL, the initialization connecting line 1173, and the node connecting line 1174 with the insulating layer(s) disposed therebetween.

The initialization voltage line VL extends in the first direction. The initialization voltage line VL may be connected to the first initialization driving thin-film transistors T4 and the second initialization driving thin-film transistor T7 through the initialization connecting line 1173. The initialization voltage line VL may have a constant voltage (e.g., −2 V, etc.).

The initialization voltage line VL is disposed on the same layer as the upper electrode Cst2, that is, the electrode voltage line HL, and may include the same material as that of the electrode voltage line HL. In the display area DA, the pixel electrode of the organic light-emitting diode OLED may be connected to the emission control thin-film transistor T6. The pixel electrode 210 may be connected to a connecting metal 1175 through a contact hole 1163, and the connecting metal 1175 may be connected to the emission control drain electrode D6 through a contact hole 1153.

Figure 3:
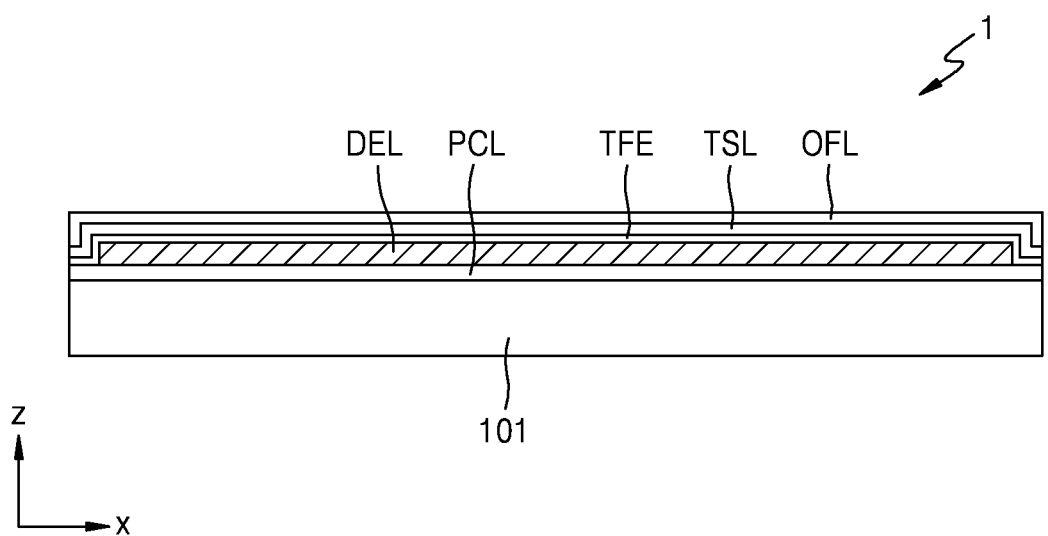
FIG. 3 is a cross-sectional view of a display device according to an embodiment.

FIG. 3 is a cross-sectional view of the display device 1 according to an embodiment.

Referring to FIG. 3, a pixel circuit layer PCL including pixel circuits and insulating layers may be disposed on the substrate 101 of the display device 1, and a display element layer DEL including a plurality of display elements may be disposed on the pixel circuit layer PCL.

The substrate 101 may include glass or a polymer resin such as polyethersulfone, polyarylate, polyetherimide, polyethylene naphthalate, polyethylene terephthalate, polyphenylene sulfide, polyimide, polycarbonate (PC), cellulose triacetate (TAC), cellulose acetate propionate, and the like.

A barrier layer (not shown) may be further included between the pixel circuit layer PCL and the substrate 101. The barrier layer prevents penetration of external foreign matter, and may include a single layer or multiple layers including inorganic materials such as silicon nitride ($SiN_x$, x>0) and silicon oxide ($SiO_x$, x>0).

The display element layer DEL may include display elements, for example, the aforementioned organic light-emitting diode OLED. The pixel circuit layer PCL may include pixel circuits and insulating layers connected to each of the organic light-emitting diodes OLED. The pixel circuit layer PCL may include a plurality of transistors and storage capacitors, and insulating layers disposed therebetween.

The display elements may be covered by an encapsulation member such as a thin-film encapsulation layer TFE. The thin-film encapsulation layer TFE may include at least one inorganic encapsulation layer and at least one organic encapsulation layer covering the display element layer DEL. The inorganic encapsulation layer may include at least one inorganic material of aluminum oxide, titanium oxide, tantalum oxide, hafnium oxide, zinc oxide, silicon oxide, silicon nitride, and silicon oxynitride. The organic encapsulation layer may include a polymer-based material. Examples of the polymer-based material may include an acrylic resin, an epoxy resin, polyimide, and/or polyethylene. In an embodiment, the organic encapsulation layer may include acrylate.

In another embodiment, the thin-film encapsulation layer TFE may have a structure in which an inner space between the substrate 101 and an upper substrate, which is a transparent member, is sealed by combining the substrate 101 and the upper substrate with a sealing member. At this time, an absorbent or a filler may be located in the inner space. The sealing member may be a sealant, and in another embodiment, the sealing member may include a material that is cured by a laser beam. For example, the sealing member may be a frit. In more detail, the sealing member may include a urethane resin, an epoxy resin, and an acrylic resin which are organic sealants, or silicone which is an inorganic sealant. As the urethane resin, for example, urethane acrylate, etc. may be used. As acrylic resin, for example, butyl acrylate, ethylhexyl acrylate, etc. may be used. Meanwhile, the sealing member may include a material that is cured by heat.

A touch electrode layer TSL including touch electrodes may be disposed on the thin-film encapsulation layer TFE, and an optical functional layer OFL may be disposed on a touch electrode layer TSL. The touch electrode layer TSL may obtain coordinate information according to an external input, for example, a touch event. The optical functional layer OFL may reduce the reflectance of light (external light) incident from the outside toward the display device 1, and/or may improve the color purity of light emitted from the display device 1. In an embodiment, the optical functional layer OFL may include a retarder and a polarizer. The retarder may be of a film type or a liquid crystal coating type, and may include $\lambda/2$ retarder and/or a $\lambda/4$ retarder. The polarizer may also be of a film type or a liquid crystal coating type. The film type may include a stretch-type synthetic resin film, and the liquid crystal coating type may include liquid crystals arranged in a certain arrangement. The retarder and the polarizer may further include a protective film.

In another embodiment, the optical functional layer OFL may include a black matrix and color filters. The color filters may be arranged considering the color of light emitted from each of pixels of the display device 1. Each of the color filters may include a red, green, or blue pigment or dye. Alternatively, each of the color filters may further include a quantum dot in addition to the aforementioned pigment or dye. Alternatively, some of the color filters may not include the aforementioned pigment or dye and may include scattering particles such as titanium oxide.

In another embodiment, the optical functional layer OFL may include a destructive interference structure. The destructive interference structure may include a first reflective layer and a second reflective layer disposed on respective layers. First reflected light and second reflected light respectively reflected by the first reflective layer and the second reflective layer may be destructively interfered, and thus external light reflectance may be reduced.

An adhesive member may be disposed between the touch electrode layer TSL and the optical functional layer OFL. The adhesive member may employ a general member known in the art without limitation. The adhesive member may be a pressure sensitive adhesive (PSA).

Figure 4A:
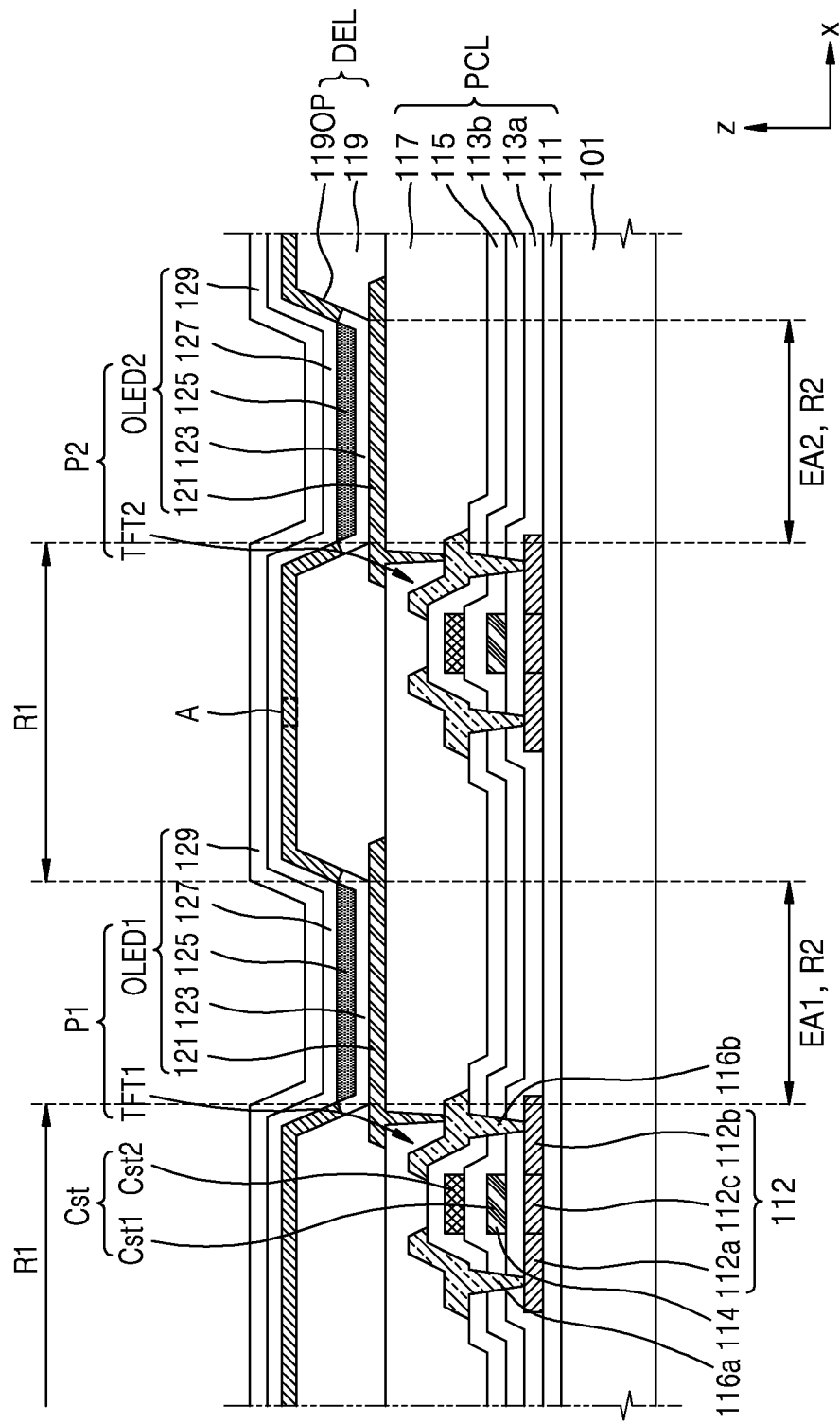
FIG. 4A is a cross-sectional view of a portion of a first pixel and a second pixel adjacent to the first pixel in a display device according to an embodiment.
Figure 4B:
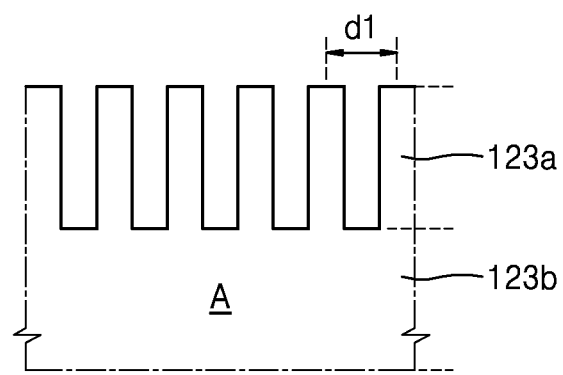
FIG. 4B is an enlarged view of portion A of a first functional layer corresponding to a first region of a display device according to an embodiment.
Figure 4C:
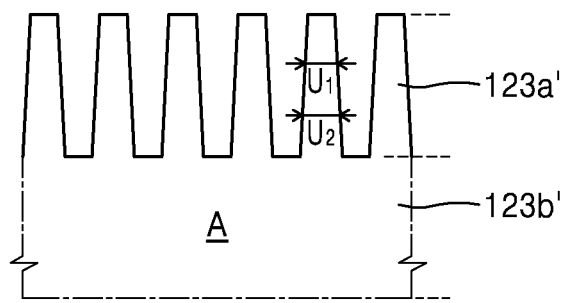
FIG. 4C is an enlarged view of portion A of a first functional layer corresponding to a first region of a display device according to another embodiment.

FIG. 4A is a cross-sectional view of a portion of a first pixel P1 and a second pixel P2 adjacent to the first pixel P1 of a display device according to an embodiment. FIG. 4B is an enlarged view of portion A of a first functional layer 123 corresponding to a first region R1 of a display device according to an embodiment. FIG. 4C is an enlarged view of portion A of the first functional layer 123 corresponding to the first region R1 of a display device according to another embodiment.

The pixel circuit layer PCL is disposed on the substrate 101. FIG. 4A shows that the pixel circuit layer PCL, which is disposed below or/and above a thin-film transistor and components of the thin-film transistor, includes a buffer layer 111, a first gate insulating layer 113*a*, a second gate insulating layer 113*b*, an interlayer insulating layer 115, and a planarization insulating layer 117. The thin-film transistor may include a first thin-film transistor TFT1 and a second thin-film transistor TFT2.

Hereinafter, since the configuration of the second thin film transistor TFT2 is similar to that of the first thin film transistor TFT1, the first thin film transistor TFT1 will be mainly described, and the detailed description of the second thin film transistor TFT2 will be omitted.

The buffer layer 111 may include an inorganic insulator such as silicon nitride, silicon oxynitride, and silicon oxide, and may include a single layer or multiple layers including the aforementioned inorganic insulating material.

The first thin film transistor TFT1 may include a semiconductor layer 112, and the semiconductor layer 112 may include polysilicon. Alternatively, the semiconductor layer 112 may include amorphous silicon, an oxide semiconductor, an organic semiconductor, or the like. The semiconductor layer 112 may include a channel region 112c and a drain region 112a and a source region 112b disposed at both sides of the channel region 112c, respectively. A gate electrode 114 may overlap the channel region 112c.

The gate electrode 114 may include a low resistance metal material. The gate electrode 114 may include a conductive material including molybdenum (Mo), aluminum (Al), copper (Cu), titanium (Ti), or the like, and may be formed as a single layer or multiple layers including the above-described materials.

The first gate insulating layer 113a may be disposed between the semiconductor layer 112 and the gate electrode 114. The first gate insulating layer 113a may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113b may be provided to cover the gate electrode 114. Similar to the first gate insulating layer 113a, the second gate insulating layer 113b may include an inorganic insulating material such as $SiO_2$, $SiN_x$, SiON, $Al_2O_3$, $TiO_2$, $Ta_2O_5$, $HfO_2$, or $ZnO_2$.

The upper electrode Cst2 of the storage capacitor Cst may be disposed on the second gate insulating layer 113b. The upper electrode Cst2 may overlap the gate electrode 114 disposed therebelow. In this case, the gate electrode 114 and the upper electrode Cst2 overlapping each other with the second gate insulating layer 113b disposed therebetween may form the storage capacitor Cst. That is, the gate electrode 114 may function as the lower electrode Cst1 of the storage capacitor Cst.

As such, the storage capacitor Cst and the first thin film transistor TFT1 may overlap each other. In some embodiments, the storage capacitor Cst may not overlap the first thin film transistor TFT1.

The upper electrode Cst2 may include Al, platinum (Pt), palladium (Pd), silver (Ag), magnesium (Mg), gold (Au), neodymium (Nd), iridium (Ir), chromium (Cr), nickel (Ni), calcium (Ca), molybdenum (Mo), Ti, tungsten (W), and/or Cu, and may include a single layer or multiple layers of the aforementioned materials.

The interlayer insulating layer 115 may cover the upper electrode Cst2. The interlayer insulating layer 115 may include $SiO_2$, $SiN_x$, SiON, $Al_2O_3$, $TiO_2$, $Ta_2O_5$, $HfO_2$, or $ZnO_2$. The interlayer insulating layer 115 may include a single layer or multiple layers including the above-described inorganic insulating material.

A drain electrode 116a and a source electrode 116b may be disposed on the interlayer insulating layer 115, respectively. The drain electrode 116a and the source electrode 116b may include a material having good conductivity. The drain electrode 116a and the source electrode 116b may include a conductive material including Mo, Al, Cu, Ti, and the like, and may be formed as a single layer or multiple layers including the above-described materials. In an embodiment, the drain electrode 116a and the source electrode 116b may have a multilayer structure of Ti/Al/Ti.

The planarization insulating layer 117 may include an organic insulating layer. The planarization insulating layer 117 may include an organic insulation material such as a general commercial polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof.

The display element layer DEL is disposed on the pixel circuit layer PCL having the above-described structure. The display element layer DEL includes a first organic light-emitting diode OLED1 and a second organic light-emitting diode OLED2, and a pixel electrode 121 of the first organic light-emitting diode OLED1 may be electrically connected to the first thin film transistor TFT1 through a contact hole formed through the planarization insulating layer 117. In addition, a pixel electrode of the second organic light-emitting diode OLED2 may be electrically connected to the second thin film transistor TFT2 through the contact hole formed through the planarization insulating layer 117.

Hereinafter, since the second organic light-emitting diode OLED2 is similar to the first organic light-emitting diode OLED1, the first organic light-emitting diode OLED1 will be mainly described, and the detailed description of the second organic light-emitting diode OLED2 will be omitted.

The pixel electrode 121 may include a conductive oxide such as indium tin oxide (ITO), indium zinc oxide (IZO), zinc oxide (ZnO), indium oxide (In.sub.2O.sub.3), indium gallium oxide (IGO), and aluminum zinc oxide (AZO). In another embodiment, the pixel electrode 121 may include a reflective layer including Ag, Mg, Al, Pt, Pd, Au, Ni, Nd, Ir, Cr, or a compound thereof. In another embodiment, the pixel electrode 121 may further include a film formed of ITO, IZO, ZnO, or In.sub.2O.sub.3 above/below the above-described reflective layer.

A pixel defining layer 119 having an opening 119OP exposing a center portion of the pixel electrode 121 is disposed on the pixel electrode 121. The pixel defining layer 119 may include an organic insulator and/or an inorganic insulator. The opening 119OP may define a light-emitting region (hereinafter, referred to as a first light-emitting region, EA1) of light emitted from the first organic light-emitting diode OLED1. For example, a width of the opening 119OP may correspond to a width of the first light-emitting area EA1. In more detail, the width of the opening 119OP may be defined as a size at which a central portion of the pixel electrode 121 is exposed.

The first functional layer 123 may cover the pixel defining layer 119. The first functional layer 123 may include a single layer or multiple layers. The first functional layer 123 may be a hole transport layer HTL having a single layer structure. Alternatively, the first functional layer 123 may include a hole injection layer HIL and a hole transport layer HTL. The first functional layer 123 may be a common layer formed to entirely cover the substrate 101.

The first functional layer 123 may include the first region R1 between the first organic light-emitting diode OLED1 and the second organic light-emitting diode OLED2. In an embodiment, the first region R1 may be disposed on the pixel defining layer 119. In another embodiment, the first region R1 may extend to at least a portion of an inner surface of the opening 119OP. For example, the first region R1 may be adjacent to the first light-emitting region EA1. In addition, the first region R1 may be adjacent to a light-emitting region (hereinafter, referred to as a second light-emitting region, EA2) of light emitted from the second organic light-emitting diode OLED2. In more detail, the first region R1 may be disposed on the side surface of the pixel defining layer 119 on which an upper portion of the pixel defining layer 119 and the opening 119OP are disposed.

The first functional layer 123 included in the first region R1 may include first protrusions 123a spaced apart from each other. Referring to FIG. 4B, the first functional layer 123 may include the first protrusions 123a in the first region R1. In addition, the first functional layer 123 may include a first lower region 123b to which the first protrusions 123a are respectively connected in the first region R1. The first protrusions 123a and the first lower region 123b may be formed of the same material, formed in one piece and formed at the same time.

In an embodiment, the first protrusions 123a may be spaced apart from each other. For example, the first protrusions 123a may be spaced apart from each other at a first interval d1. The first interval d1 may be a distance between centers of the adjacent first protrusions 123a. In another embodiment, the first protrusions 123a may be spaced apart from each other at various intervals. For example, an interval between the first protrusions 123a may be about 1 μm or more and about 30 μm or less. In more detail, the first interval d1 may be 10 μm.

The size of a first protrusion 123a may be provided at about 1 μm or more and about 30 μm or less. In more detail, the size of the first protrusion 123a may be about 10 μm. Referring to FIG. 4B, the first protrusions 123a are provided in the same size, but in another embodiment, the first protrusions 123a may have various sizes.

In an embodiment, the first protrusion 123a may have a rectangular cross-sectional shape. However, in another embodiment, the first protrusion 123a may be a polygon such as a triangular trapezoid in cross section. In another embodiment, the first protrusion 123a may include a curvature portion.

Referring to FIG. 4C, the cross-sectional shape of a first protrusion 123a' may be trapezoidal. In more detail, a width U1 of the first protrusion 123a' at a first point may be less than a width U2 of the first protrusion 123a' at a second point which is disposed closer to a first lower region 123b' than the first point.

Referring again to FIG. 4A, the first functional layer 123 may include a second region R2 in which a light-emitting layer 125, which will be described later below, is disposed. In an embodiment, a width of the second region R2 may be equal to a width of the first light-emitting region EA1 or a second light-emitting region EA2. However, in another embodiment, the width of the second region R2 may be greater than the width of the first light-emitting region EA1 or the second light-emitting region EA2.

In another aspect, the first functional layer 123 may include a portion disposed in the first region R1 and a portion disposed in the second region R2. The portion disposed in the second region R2 may be a portion of the first functional layer 123 that is not disposed in the first region R1.

In an embodiment, unlike the first region R1, the second region R2 may be a portion that does not include the first protrusion 123a. In more detail, the first protrusion 123a may be disposed in the first region R1, and the first protrusion 123a may not be disposed in the second region R2. Although not shown in the drawings, in another embodiment, the second region R2 may include the protrusion and the first region R1 may not include the protrusion. However, for convenience of description, a case where the first protrusion 123a is provided in the first region R1 to form the surface of the first functional layer 126 to be a hydrophobic surface and the first protrusion 123a is not provided in the second region R2 will be described in detail.

At least one of the first region R1 and the second region R2 may be a hydrophobic region, and the other of the first region R1 and the second region R2 may be a hydrophilic region. For example, the first region R1 may be a hydrophobic region and the second region R2 may be a hydrophilic region. In more detail, the first region R1 including the first protrusion 123a of the first functional layer 123 may be a hydrophobic region, and the second region R2 may be a hydrophilic region. That is, due to the first protrusion 123a, a contact angle with liquid (e.g., a light-emitting layer) in the first region R1 may be about 150 degrees or more. Therefore, the first region R1 may exhibit super hydrophobicity and super water-repellency.

In another embodiment, the first region R1 may be a hydrophilic region and the second region R2 may be a hydrophobic region. In more detail, a contact angle with another material (e.g., a light-emitting layer) in the second region R2 may be about 150 degrees or more. Accordingly, the second region R2 may be hydrophobic, and the first region R1 may be hydrophilic.

The light-emitting layer 125 may be disposed in the opening 119OP of the pixel defining layer 119. In more detail, the light-emitting layer 125 may be disposed on the second region R2 of the first functional layer 123. The light-emitting layer 125 may include a polymer organic material or a low-molecular organic material that emits light of a certain color.

In an embodiment, an upper surface of the light-emitting layer 125 may be substantially parallel to an upper surface of the substrate 101. For example, the upper surface of the light-emitting layer 125 may be disposed parallel to the x direction. Therefore, the upper surface of the light-emitting layer 125 may be flat.

Both ends of the light-emitting layer 125 in a cross-sectional view may be disposed adjacent to the first region R1. For example, one side of the light-emitting layer 125 may contact the first region R1 between the first organic light-emitting diode OLED1 and the second organic light-emitting diode OLED2. In other words, a boundary between the first region R1 and the second region R2 may be decided considering a thickness of the light-emitting layer 125. In more detail, the light-emitting layer 125 may extend from the central portion of the pixel electrode 121 to at least a portion of the inner surface of the opening 119OP.

At least one of the first region R1 and the second region R2 may be a hydrophilic region, and the other may be a hydrophobic region. For example, when the emission layer 125 includes a hydrophilic material, the first region R1 of the first functional layer 123 may be hydrophobic and the second region R2 of the first functional layer 123 may be hydrophilic. Therefore, the light-emitting layer 125 may be disposed mainly in the second region R2. In another example, when the emission layer 125 includes a hydrophobic material, the first region R1 of the first functional layer 123 may be hydrophilic, and the second region R2 of the first functional layer 123 may be hydrophobic. Therefore, the light-emitting layer 125 may be disposed mainly in the second region R2.

A second functional layer 127 may be disposed on the light-emitting layer 125 and the first functional layer 123.

The second functional layer 127 may include a single layer or multiple layers. The second functional layer 127 may include an electron transport layer (ETL) and/or an electron injection layer (EIL). The second functional layer 127 may be integrally formed to entirely cover the substrate 101.

An opposite electrode 129 may be disposed on the second functional layer 127. The opposite electrode 129 may include a conductive material having a low work function. For example, the opposite electrode 129 may include a (semi) transparent electrode including Ag, Mg, Al, Pt, Pd, Au, Ni, Nd, Ir, Cr, or an alloy thereof. Alternatively, the opposite electrode 129 may further include a transparent conductive layer such as ITO, IZO, ZnO, or $In_2O_3$ on the (semi) transparent layer including the above-mentioned material.

The arrangement of the first region R1 and the light-emitting layer 125 as described above may be to flatten the upper surface of the light-emitting layer 125. Furthermore, the arrangement of the first region R1 and the light-emitting layer 125 may be to control the shape of the upper surface of the light-emitting layer 125. In more detail, the first functional layer 123 includes the first region R1 and the second region R2, and at least one of the first region R1 and the second region R2 is a hydrophobic region, and the other may be a hydrophilic region. For example, when the emission layer 125 includes a hydrophilic material, the first region R1 may be provided as a hydrophobic region and the second region R2 may be provided as a hydrophilic region. Accordingly, the light-emitting layer 125 may have a large contact angle with the first region R1 and a small contact angle with the second region R2.

When each surface of the first region R1 and the second region R2 is the same hydrophilic or hydrophobic, the shape of the upper surface of the light-emitting layer 125 disposed on the first functional layer 123 may not be controlled. For example, the surface of the light-emitting layer 125 may have a concave shape due to an adhesive force between the first functional layer 123 and the light-emitting layer 125 disposed in the opening 119OP.

In the present embodiment, at least one of the first region R1 and the second region R2 of the first functional layer 123 is provided as a hydrophilic region and the other as a hydrophobic region. Thus, the shape of the upper surface of the light-emitting layer 125 disposed in the opening 119OP may be controlled.

Hereinafter, a method of manufacturing a display device including the first region R1 and the second region R2 will be described in detail with reference to FIGS. 5A to 5C.

Figure 5A:
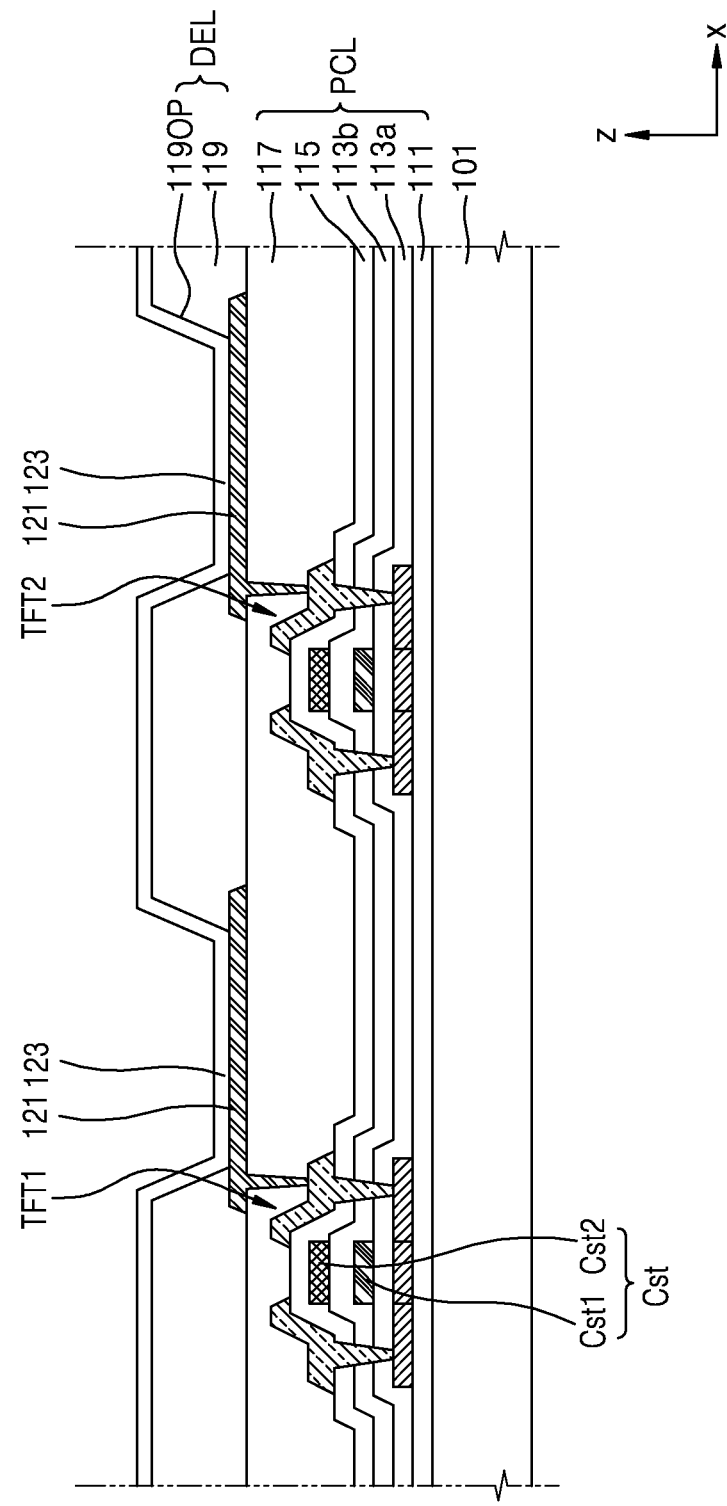
FIGS. 5A, 5B and 5C are cross-sectional views for explaining a method of manufacturing a display device according to an embodiment.
Figure 5B:
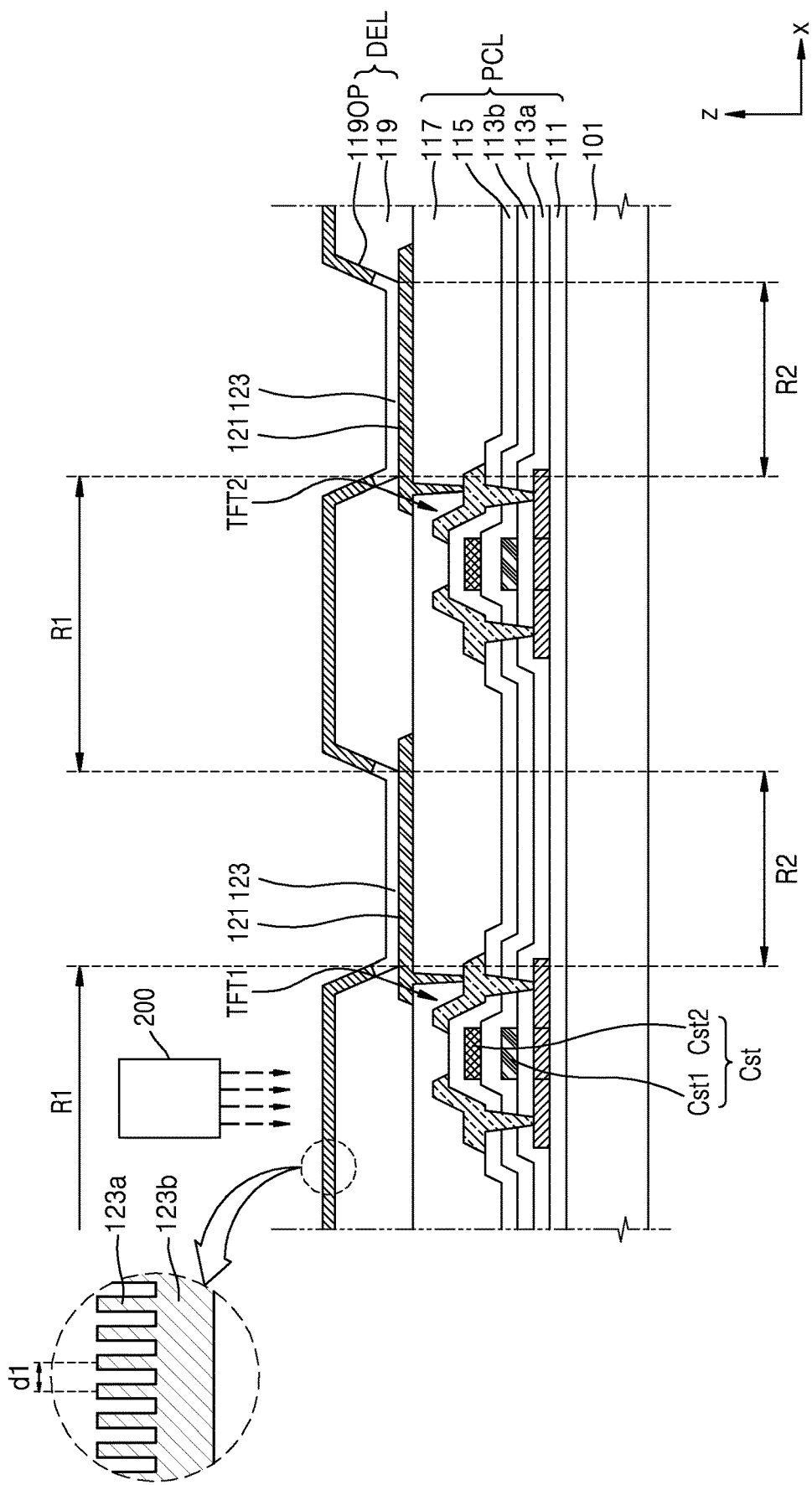
Figure 5C:
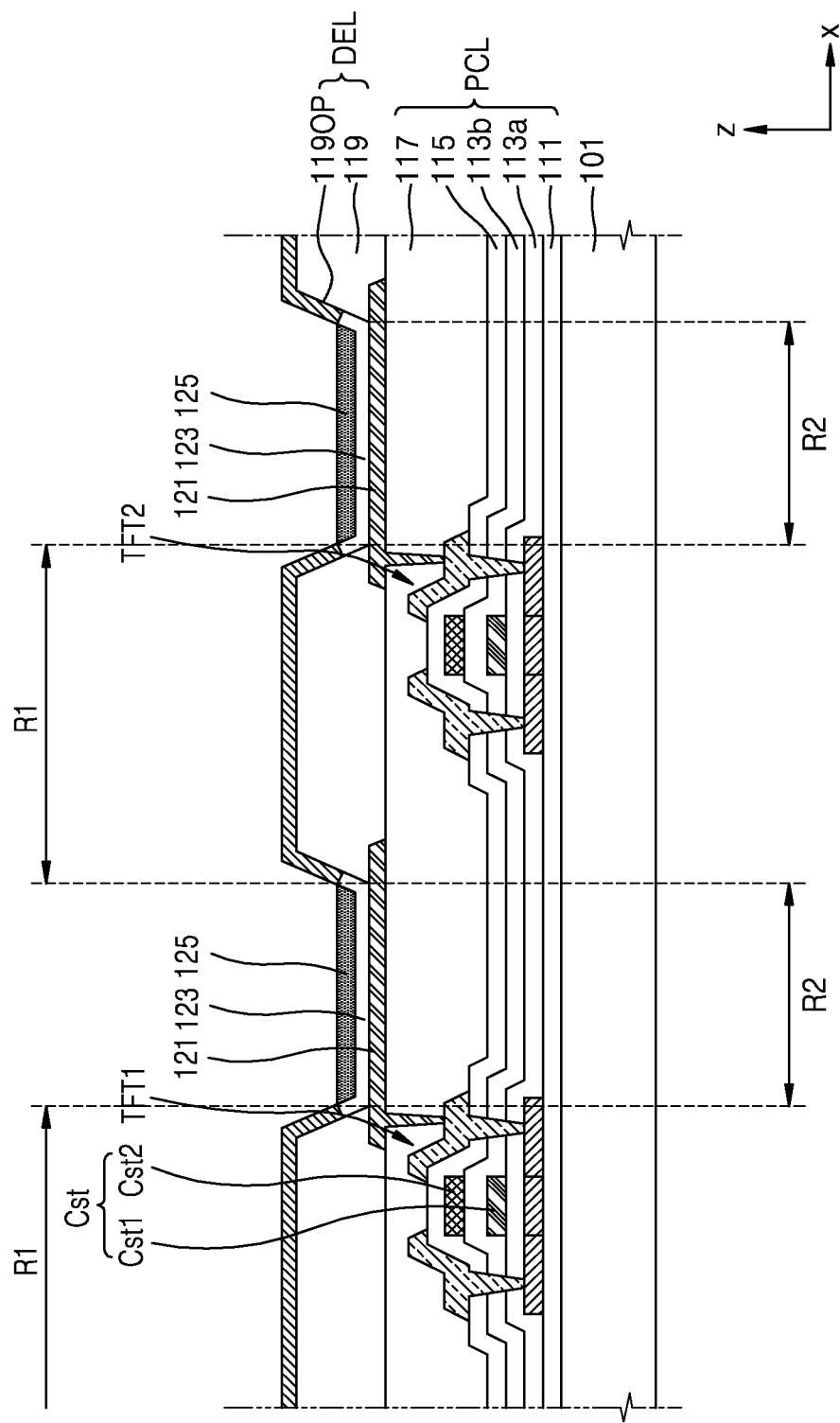

FIGS. 5A to 5C are cross-sectional views for explaining a method of manufacturing a display device according to an embodiment. In FIGS. 5A to 5C, the same reference numerals as used in FIGS. 4A and 4B denote the same elements, and a duplicate description will not be given herein.

Referring to FIG. 5A, first, the substrate 101 is prepared, and the pixel circuit layer PCL is formed on the substrate 101.

Next, the display element layer DEL may be formed on the pixel circuit layer PCL. That is, the pixel electrode 121 may be formed, and the pixel defining layer 119 having the opening 119OP exposing the central portion of the pixel electrode 121 may be formed. In addition, the first functional layer 123 may be formed on the pixel defining layer 119.

Referring to FIG. 5B, in an embodiment, the first protrusion 123a may be formed on the surface of the first functional layer 123 corresponding to the first region R1. In more detail, the first protrusion 123a may be formed on the upper portion of the pixel defining layer 119 included in the first region R1 and at least a portion of the inner surface of the opening 119OP. In another embodiment, the first region R1 may extend to the inner surface of the opening 119OP to form the first protrusion 123a. In another embodiment, although not shown in the drawings, the first protrusion 123a may be formed only on the surface of the first functional layer 123 corresponding to the second region R2. However, for convenience of description, a case where the first protrusion 123a is formed in the first region R1 will be described in detail.

The first protrusions 123a may be formed to be spaced apart from each other. In an embodiment, the first protrusions 123a may be spaced apart from each other at the first interval d1. In another embodiment, the first protrusions 123a may be spaced apart from each other at various intervals. For example, an interval between the first protrusions 123a may be about 1 μm or more and about 30 μm or less. In more detail, the first interval d1 may be 10 μm.

The size of the first protrusion 123a may be provided at about 1 μm or more and about 30 μm or less. In more detail, the size of the first protrusion 123a may be about 10 μm. Referring to FIG. 5B, the first protrusions 123a are provided in the same size, but in another embodiment, the first protrusions 123a may have various sizes.

In an embodiment, the first protrusion 123a may have a rectangular cross-sectional shape. However, in another embodiment, the first protrusion 123a may be a polygon such as a triangular trapezoid in cross section. In another embodiment, the first protrusion 123a may include a curvature portion.

In an embodiment, the first functional layer 123 may include the second region R2 in which the light-emitting layer 125 is formed. In an embodiment, the width of the second region R2 may be equal to a width of a first light-emitting region (not shown) or a second light-emitting region (not shown). In another embodiment, the width of the second region R2 may be greater than the width of the first light-emitting region or the second light-emitting region.

In forming the protrusions in the first region R1, a laser beam generated from a laser source 200 may be used. The laser source 200 may be a laser source generally known in the art such as a UV pico laser, a Femto ultra laser, etc. In addition, the laser source 200 may be changed according to a material included in the first functional layer 123.

Next, referring to FIG. 5C, the light-emitting layer 125 may be formed. In more detail, the light-emitting layer 125 may be disposed on the second region R2 of the first functional layer 123. The light-emitting layer 125 may include a polymer or a low-molecular organic material that emits light of a certain color. The light-emitting layer 125 may use a conventional method such as inkjet printing, spin coating, or thermal transfer using a laser beam. Hereinafter, a case in which the light-emitting layer 125 is formed using a method of manufacturing inkjet printing will be described in detail.

In an embodiment, the upper surface of the light-emitting layer 125 may be parallel to the upper surface of the substrate 101. For example, the upper surface of the light-emitting layer 125 may be parallel to the x direction of FIG. 5C. Therefore, the upper surface of the light-emitting layer 125 may be flat.

Both ends of the light-emitting layer 125 in a cross-sectional view may be adjacent to the first region R1. For example, one side of the light-emitting layer 125 may be formed to contact the first region R1. In more detail, the light-emitting layer 125 may extend from the central portion of the pixel electrode 121 to at least a portion of the inner surface of the opening 119OP.

As described above, forming the first region R1 and forming the light-emitting layer 125 may be to flatten the upper surface of the light-emitting layer 125. Furthermore, forming the first region R1 and forming the light-emitting layer 125 may be to control the shape of the upper surface of the light-emitting layer 125. In more detail, at least one of the first region R1 and the second region R2 may be a hydrophobic region, and the other may be a hydrophilic region. For example, when the emission layer 125 includes a hydrophilic material, the first region R1 may be provided as a hydrophobic region and the second region R2 may be provided as a hydrophilic region. Therefore, a contact angle between the first region R1 and the light-emitting layer 125 may be greater. When a protrusion of the first region R1 is formed, the shape of the upper surface of the light-emitting layer 125 may be adjusted while controlling a width of the first region R1 disposed in the opening 119OP.

In addition, when the light-emitting layer 125 is manufactured using the inkjet printing method, an accurate alignment between an inkjet outlet port (not shown) and the second region R2 may be required. When the inkjet outlet and the second region R2 are not aligned accurately, the light-emitting layer 125 may be formed in a region other than the opening 119OP. That is, Ink may accumulate on the upper surface of the pixel defining layer 119 to cause a poor organic light-emitting diode.

However, as in the embodiment of the disclosure, the problem may be solved by forming the light-emitting layer 125 on the opening 119OP while at least one of the first region R1 and the second region R2 is formed as a hydrophilic region and the other as a hydrophobic region. That is, even when the light-emitting layer 125 is formed on the first region R1 because the inkjet outlet and the second region R2 are not aligned with respect to each other accurately, the light-emitting layer 125 may flow into the second region R2 to enable accurate patterning.

Figure 6:
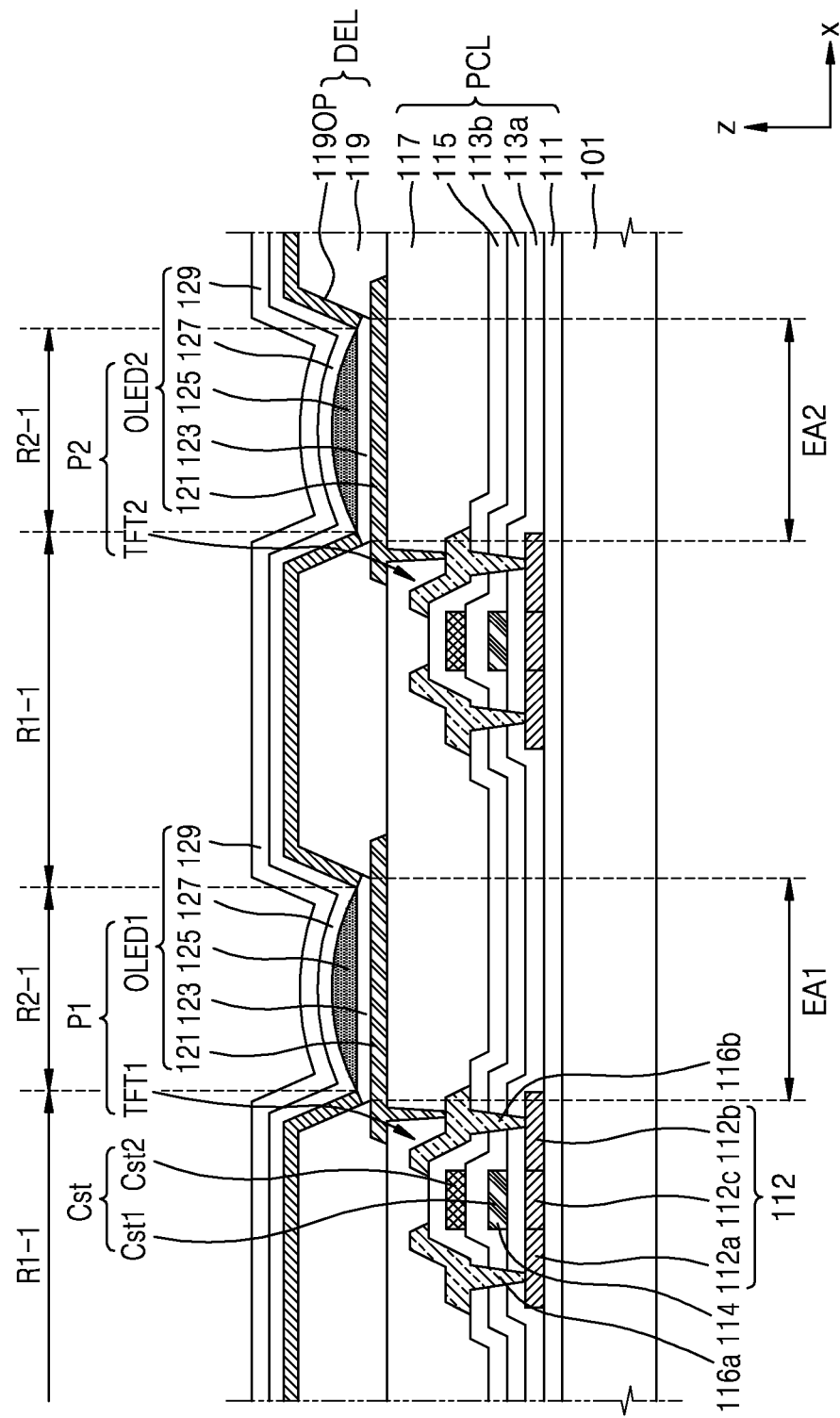
FIG. 6 is a cross-sectional view of a portion of a first pixel and a second pixel adjacent to the first pixel in a display device according to another embodiment.

FIG. 6 is a cross-sectional view of a portion of the first pixel P1 and the second pixel P2 adjacent to the first pixel P1 in a display device according to another embodiment.

In FIG. 6, the same reference numerals as used in FIG. 4A denote the same elements, and a duplicate description will not be given herein.

Referring to FIG. 6, the pixel circuit layer PCL and the display element layer DEL may be disposed on the substrate 101. The first functional layer 123 included in a first region R1-1 may include first protrusions spaced apart from each other.

Meanwhile, the first region R1-1 may extend to the inner surface of the opening 119OP. Accordingly, the first region R1-1 may be entirely disposed on the upper surface of the pixel defining layer 119 between the first organic light-emitting diode OLED1 and the second organic light-emitting diode OLED2 and the opening 119OP.

A width of a second region R2-1 may be less than the width of the opening 119OP. In more detail, the second region R2-1 may be a portion of the first functional layer 123 that is not the first region R1-1. If the first region R1-1 extends to the inner surface of the opening 119OP, the width of the second region R2-1 may be reduced. Accordingly, the width of a second region R2-1 may be less than the width of the opening 119OP.

The light-emitting layer 125 may be disposed in the opening 119OP. Meanwhile, the light-emitting layer 125 may be disposed in the second region R2-1. Since the width of the second region R2-1 may be less than the width of the opening 119OP, the light-emitting layer 125 may be disposed in the opening 119OP.

The surface of the light-emitting layer 125 may be convex. Since at least one of the first region R1-1 and the second region R2-1 is a hydrophobic region and the other is a hydrophilic region, a contact angle between the light-emitting layer 125 and the first region R1-1 may be greater. In more detail, the light-emitting layer 125 may be disposed in a bow shape in cross section.

Therefore, in the embodiment, the shape of the light-emitting layer 125 may be controlled by adjusting the width of the first region R1-1.

Figure 7:
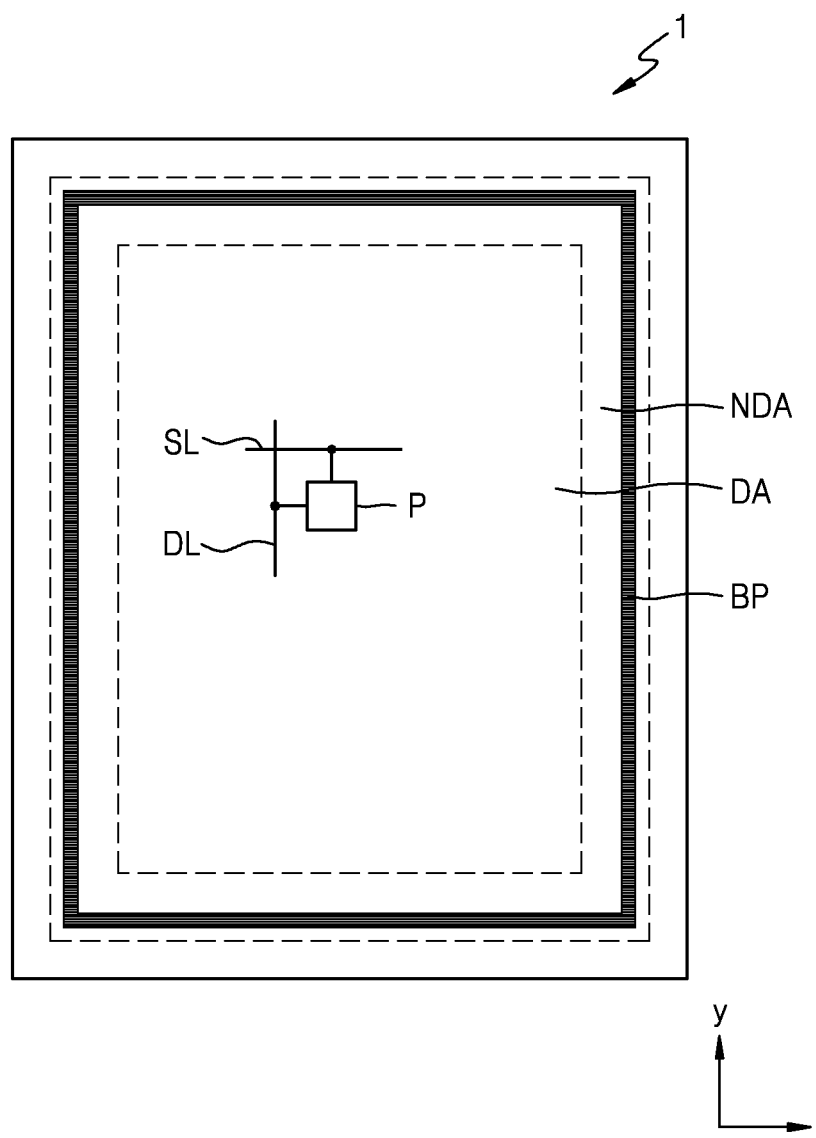
FIG. 7 is a plan view of a display device according to another embodiment.
Figure 8:
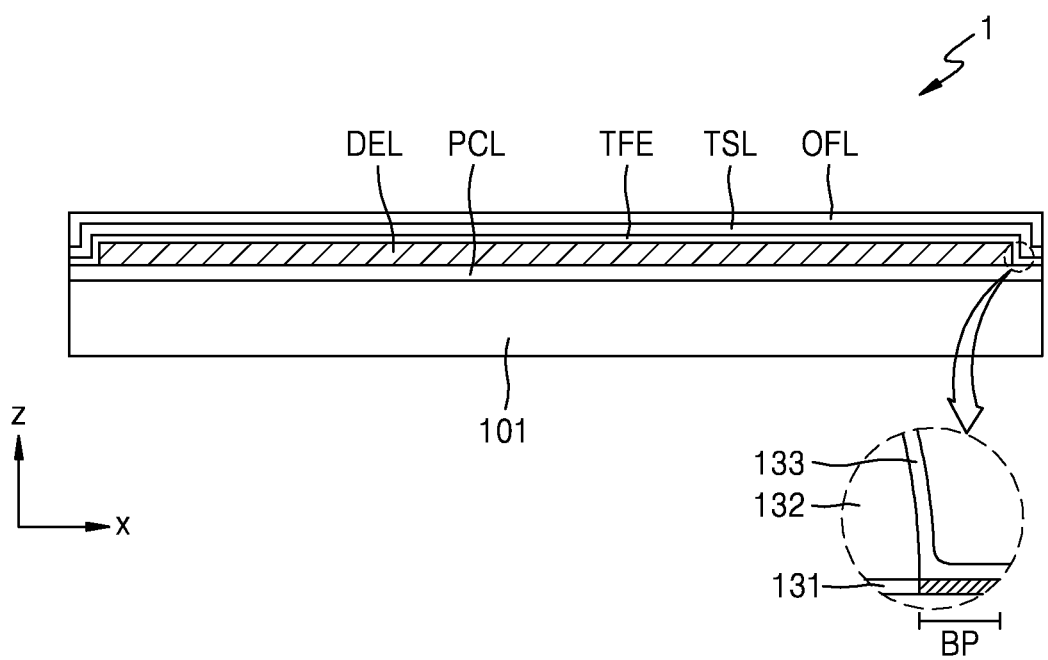
FIG. 8 is a cross-sectional view of a display device according to another embodiment.

FIG. 7 is a plan view of the display device 1 according to another embodiment. FIG. 8 is a cross-sectional view of the display device 1 according to another embodiment.

In FIGS. 7 and 8, the same reference numerals as used in FIGS. 1 and 3 denote the same elements, and a duplicate description will not be given herein.

In an embodiment, the display device 1 may include liquid crystal displays, electrophoretic displays, organic light-emitting displays, inorganic light-emitting displays, field emission displays, surface-conduction electron-emitter displays, quantum dot displays, plasma displays, and cathode ray displays. Hereinafter, although an organic light-emitting display device will be described as an example, embodiments may be applied to the display devices of various methods as described above.

Referring to FIG. 7, a boundary portion BP may be provided on an inorganic encapsulation layer to surround the display area DA. In more detail, the boundary portion BP may be disposed on the non-display area NDA to surround the display area DA.

Referring to FIG. 8, the thin-film encapsulation layer TFE may include at least one inorganic encapsulation layer and at least one organic encapsulation layer. In an embodiment, the thin-film encapsulation layer TFE may include a first inorganic encapsulation layer 131, an organic encapsulation layer 132, and a second inorganic encapsulation layer 133. In another embodiment, the thin-film encapsulation layer TFE may further include at least one inorganic encapsulation layer and at least one organic encapsulation layer, and may be alternately stacked. Hereinafter, for convenience of description, a case in which the thin-film encapsulation layer TFE includes the first inorganic encapsulation layer 131, the organic encapsulation layer 132, and the second inorganic encapsulation layer 133 will be described in detail.

Meanwhile, the boundary portion BP may be disposed on the first inorganic encapsulation layer 131, and the organic encapsulation layer 132 may be disposed from the display area DA to an inner boundary of the boundary portion BP. In an embodiment, the second inorganic encapsulation layer 133 may contact the first inorganic encapsulation layer 131 at the boundary portion BP.

Figure 9:
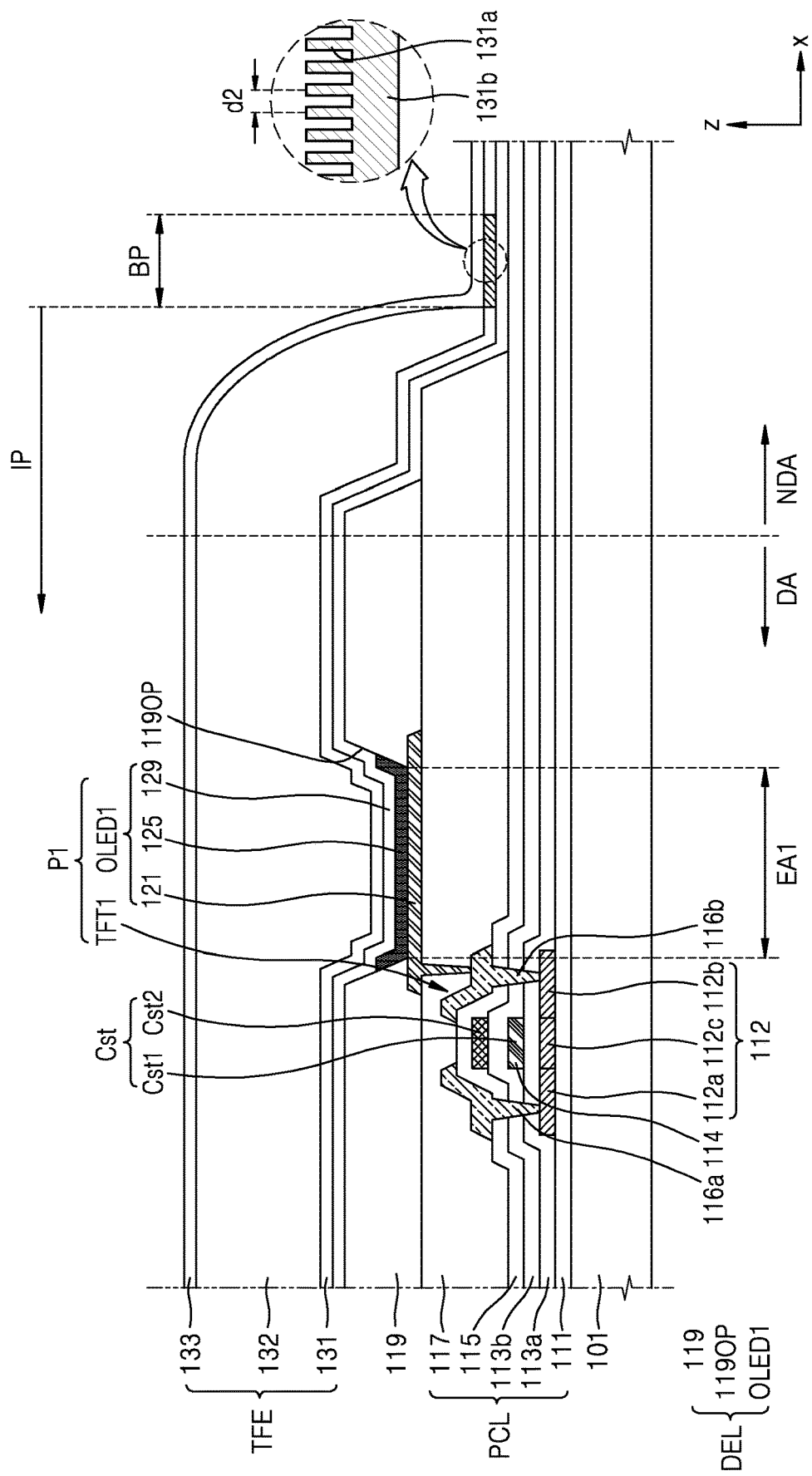
FIG. 9 is a cross-sectional view of a portion of a first pixel in a display device according to another embodiment.

FIG. 9 is a cross-sectional view of a portion of the first pixel P1 in a display device according to another embodiment.

In FIG. 9, the same reference numerals as used in FIG. 4A denote the same elements, and a duplicate description will not be given herein.

The first inorganic encapsulation layer 131 included in the boundary portion BP may include second protrusions 131a spaced apart from each other. In more detail, the first inorganic encapsulation layer 131 may include the second protrusions 131a at the boundary portion BP, and may further include a second lower region 131*b* to which the second protrusions 131*a* are respectively connected at the boundary portion BP.

In an embodiment, the second protrusions 131*a* may be spaced apart from each other. For example, the second protrusions 131*a* may be spaced apart from each other at a second interval d2. The second interval d2 may be a distance between centers of the adjacent second protrusions 131*a*. In another embodiment, the second protrusions 131*a* may be apart from each other at various intervals. For example, an interval between the second protrusions 131*a* may be about 1 µm or more and about 30 µm or less. In more detail, the second interval d2 may be 10 µm.

The size of a second protrusion 131*a* may be provided at about 1 µm or more and about 30 µm or less. In more detail, the size of the second protrusion 131*a* may be about 10 µm. Referring to FIG. 9, the second protrusions 131*a* are provided in the same size, but in another embodiment, the second protrusions 131*a* may have various sizes.

In an embodiment, the second protrusion 131*a* may have a rectangular cross-sectional shape. However, in another embodiment, the second protrusion 131*a* may be a polygon such as a triangular trapezoid in cross section. In more detail, a width of the second protrusion 131*a* at a first point may be less than a width thereof at a second point closer to the second lower region 131*b* than the first point. In another embodiment, the second protrusion 131*a* may include a curvature portion.

The first inorganic encapsulation layer 131 may include an inner portion IP disposed inside of the inner boundary of the boundary portion BP. At least one of the boundary portion BP and the inner portion IP may be a hydrophilic region, and the other may be a hydrophobic region. In more detail, the boundary portion BP including the second protrusion 131*a* of the first inorganic encapsulation layer 131 may be a hydrophobic region, and the inner portion IP may be a hydrophilic region. That is, due to the second protrusion 131*a*, a contact angle with another material (e.g., an organic encapsulation layer) at the boundary portion BP may be about 150 degrees or more. Therefore, the boundary portion BP may represent super hydrophobicity and super water-repellency. As another example, the boundary portion BP may be a hydrophilic region, and the inner portion IP may be a hydrophobic region.

The organic encapsulation layer 132 may be on the first inorganic encapsulation layer 131. In particular, as described above, the organic encapsulation layer 132 may be disposed inside of the inner boundary of the boundary portion BP. In other words, the organic encapsulation layer 132 may be on the inner portion IP and may not be on the boundary portion BP.

At least one of the boundary portion BP of the first inorganic encapsulation layer 131 and the inner portion IP of the first inorganic encapsulation layer 131 may be hydrophobic, and the other portion may be hydrophilic. For example, when the organic encapsulation layer 132 includes a hydrophilic material, the boundary portion BP of the first inorganic encapsulation layer 131 may be hydrophobic, and the inner portion IP of the first inorganic encapsulation layer 131 may be hydrophilic. As another example, when the organic encapsulation layer 132 includes a hydrophobic material, the boundary portion BP of the first inorganic encapsulation layer 131 may be hydrophilic, and the inner portion IP of the first inorganic encapsulation layer 131 may be hydrophobic. Therefore, the organic encapsulation layer 132 may be mainly disposed at the inner portion IP of the first inorganic encapsulation layer 131 and may not be disposed at the boundary portion BP of the first inorganic encapsulation layer 131.

The arrangement of the boundary portion BP and the inner portion IP may be performed to prevent the organic encapsulation layer 132 from flowing over the non-display area NDA outside the boundary portion BP.

If the surface of the boundary portion BP and the surface of the inner portion IP are equally hydrophilic or hydrophobic, a dam structure DAM or a groove needs to be further disposed to control the flow of the organic encapsulation layer 132 on the first inorganic encapsulation layer 131. The dam structure or groove may increase the size of the non-display area NDA.

If the boundary portion BP on which the second protrusion 131*a* is formed is disposed on the non-display area NDA as in the embodiment, the flow of the organic encapsulation layer 132 may be controlled without having an additional dam structure or groove. Therefore, the area of the non-display area NDA may be reduced.

Hereinafter, a method of manufacturing a display device in which the boundary portion BP is formed on the first inorganic encapsulation layer 131 will be described in detail.

FIGS. 10A to 10D are cross-sectional views for explaining a method of manufacturing a display device according to another embodiment. In FIGS. 10A to 10D, the same reference numerals as used in FIG. 9 denote the same elements, and a duplicate description will not be given herein.

Figure 10A:
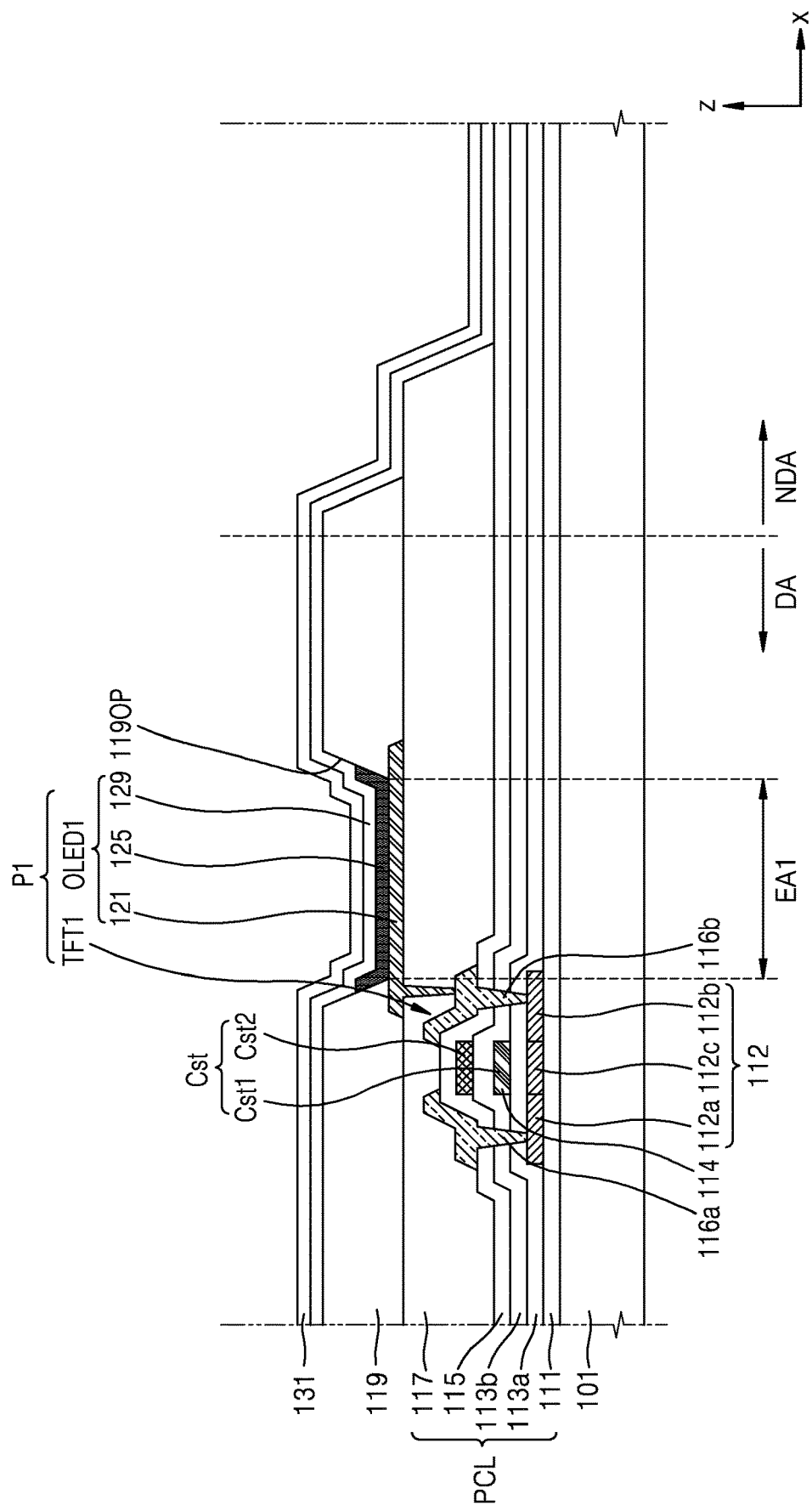
FIGS. 10A, 10B, 10C and 10D are cross-sectional views for explaining a method of manufacturing a display device according to another embodiment.

Referring to FIG. 10A, a substrate including the display area DA and the non-display area NDA may be prepared first.

Next, the pixel circuit layer PCL may be formed on the display area DA, and a display element layer may be formed on the pixel circuit layer PCL.

Thereafter, the first inorganic encapsulation layer 131 may be formed on the first organic light-emitting diode OLED1 and the pixel defining layer 119. The first inorganic encapsulation layer 131 may be formed by employing a general deposition method well known in the art without limitation. Since the first inorganic encapsulation layer 131 is formed along a lower structure thereof, an upper surface of the first inorganic encapsulation layer 131 may not be flat.

Figure 10B:
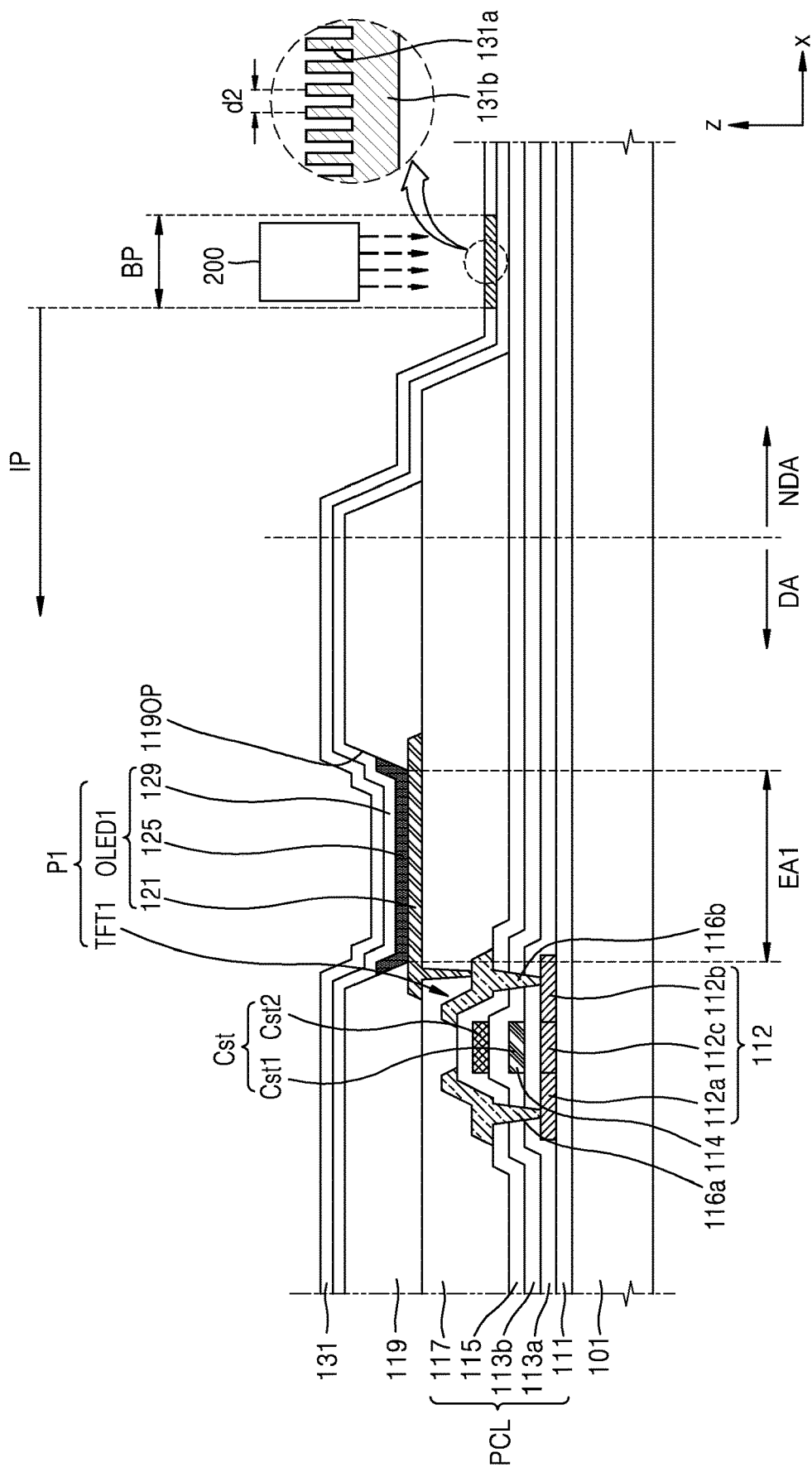

Referring to FIG. 10B, the boundary portion BP including the second protrusions 131*a* spaced apart from each other may be formed on the first inorganic encapsulation layer 131 disposed on the non-display area NDA on the boundary portion BP. The boundary portion BP may be formed to surround the display area DA.

The first inorganic encapsulation layer 131 included in the boundary portion BP may include the second protrusions 131*a* spaced apart from each other. In addition, the first inorganic encapsulation layer 131 may include the second lower region 131*b* to which the second protrusions 131*a* are respectively connected in the boundary portion BP.

In an embodiment, the second protrusions 131*a* may be spaced apart from each other. For example, the second protrusions 131*a* may be spaced apart from each other at the second interval d2. In another embodiment, the second protrusions 131*a* may be apart from each other at various intervals. For example, an interval between the second protrusions 131*a* may be about 1 µm or more and about 30 µm or less. In more detail, the second interval d2 may be 10 µm.

The size of the second protrusion 131*a* may be provided at about 1 µm or more and about 30 µm or less. In more detail, the size of the second protrusion 131*a* may be about 10 µm. Referring to FIG. 10B, the second protrusions 131*a* are provided in the same size, but in another embodiment, the second protrusions 131a may have various sizes.

In an embodiment, the second protrusion 131a may have a rectangular cross-sectional shape. Although not shown in the drawings, in another embodiment, the second protrusion 131a may be a polygon such as a triangle, a trapezoid, or the like in cross section. In more detail, a width of the second protrusion 131a at a first point may be less than a width thereof at a second point closer to the second lower region 131b than the first point. In another embodiment, the second protrusion 131a may include a curvature portion.

The first inorganic encapsulation layer 131 may include the inner portion IP disposed inside of the inner boundary of the boundary portion BP. At least one of the boundary portion BP and the inner portion IP may be a hydrophilic region, and the other may be a hydrophobic region. In more detail, the boundary portion BP including the second protrusion 131a of the first inorganic encapsulation layer 131 may be a hydrophobic region, and the inner portion IP may be a hydrophilic region.

In forming the second protrusions 131a in the boundary portion BP, a laser beam generated from the laser source 200 may be used. The laser source 200 may employ without limitation general ones well known in the art, such as UV pico and Femto ultra laser beams. In addition, the laser source 200 may be changed according to a material included in the first inorganic encapsulation layer 131.

Figure 10C:
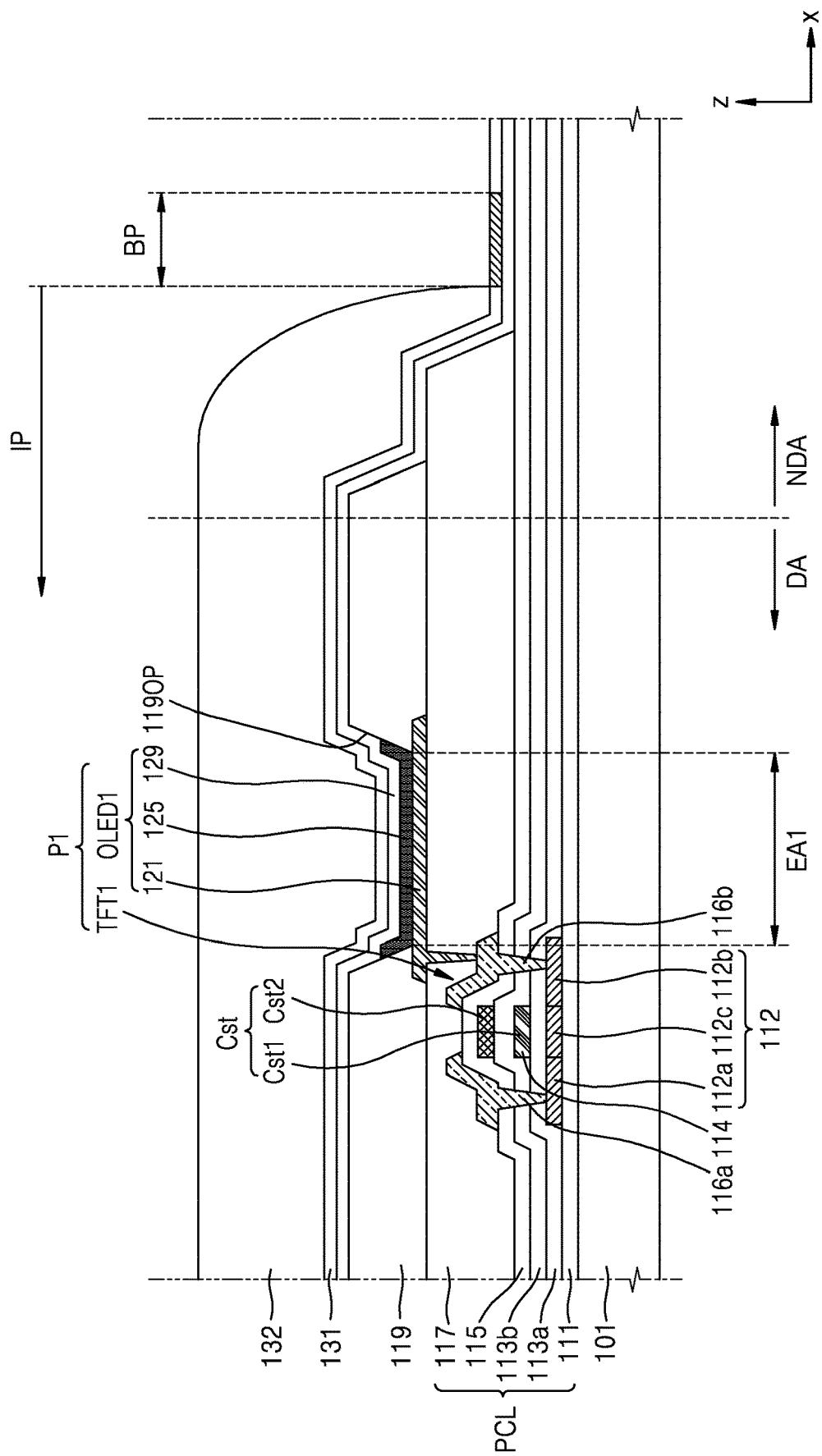

Referring to FIG. 10C, the organic encapsulation layer 132 may be disposed on the first inorganic encapsulation layer 131. In more detail, the organic encapsulation layer 132 may be disposed inside of the inner boundary of the boundary portion BP. That is, the organic encapsulation layer 132 may be formed at the inner portion IP. For example, the boundary portion BP may be hydrophobic, the inner portion IP may be hydrophilic, and the organic encapsulation layer 132 may include a hydrophilic material. In this case, the organic encapsulation layer 132 may not be formed on the boundary portion BP.

Unlike the first inorganic encapsulation layer 131, an upper surface of the organic encapsulation layer 132 may be formed to be substantially flat in the inner portion IP.

Figure 10D:
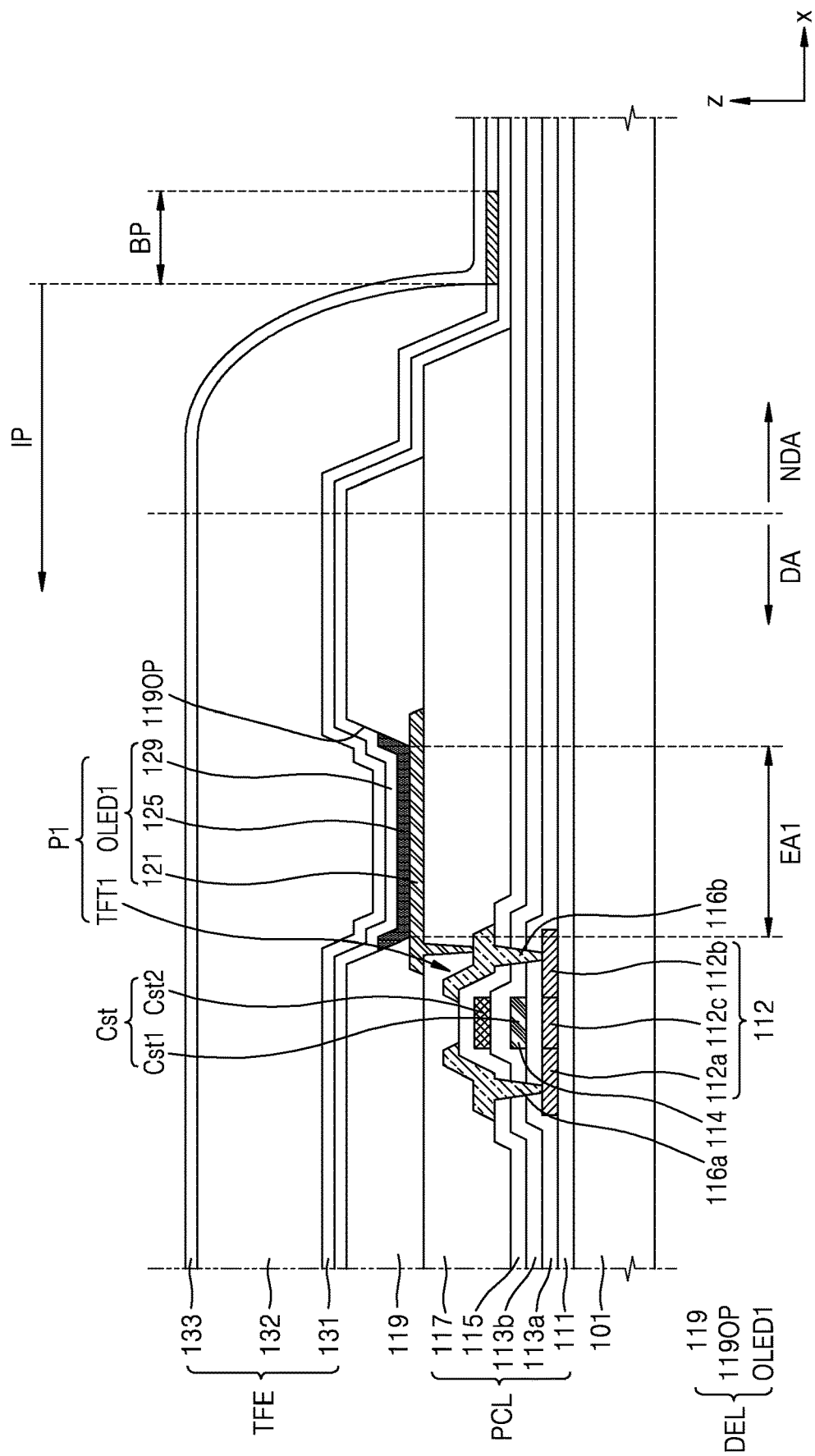

Next, referring to FIG. 10D, the second inorganic encapsulation layer 133 may be formed on the organic encapsulation layer 132 and the boundary portion BP. Unlike the organic encapsulation layer 132, the second inorganic encapsulation layer 133 may be disposed along a lower structure thereof.

The second inorganic encapsulation layer 133 may be on the first inorganic encapsulation layer 131 at the boundary portion BP. In more detail, the second inorganic encapsulation layer 133 may be formed to contact the first inorganic encapsulation layer 131 at the boundary portion BP.

If the boundary portion BP on which the second protrusion 131a is formed is disposed on the non-display area NDA as in the embodiment, the flow of the organic encapsulation layer 132 may be controlled without having an additional dam structure or groove. Therefore, the area of the non-display area NDA may be reduced.

In addition, as in the embodiment, at least one of boundary portion BP and the inner portion IP is formed as a hydrophilic region and the other is formed as a hydrophobic region by using the laser source 200 to simplify a process of manufacturing a display device.

The embodiments described in FIGS. 3 through 6 may be used together with the embodiments described in FIGS. 6 through 10D.

As described above, embodiments include protrusions spaced apart from each other in first display elements and a first region between the first display elements, so that different light-emitting layers are easily formed on each of organic light-emitting diodes emitting different colors.

In addition, a display device according to the embodiments and a display device manufactured by a method of manufacturing a display device according to embodiments may minimize a non-display area outside a display area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
   a substrate comprising a display area and a non-display area;
   a plurality of display elements disposed in the display area, each of the plurality of display elements comprising a pixel electrode, a common layer, a light-emitting layer, and an opposite electrode; and
   a pixel defining layer having an opening exposing a central portion of the pixel electrode,
   wherein the common layer comprises a first region disposed between the light-emitting layer disposed in a first display element and the light-emitting layer disposed in a second display element adjacent to the first display element among the plurality of display elements,
   wherein the common layer in the first region has a first surface which faces the opposite electrode, the first surface including upper surfaces, lower surfaces and connecting surfaces each connecting one upper surface among the upper surfaces and one lower surface among the lower surfaces which are disposed adjacent to each other, and a second surface facing the pixel defining layer, and
   wherein the first surface of the common layer in the first region has an unevenness greater than that of the second surface of the common layer in the first region.

2. The display device of claim 1, wherein an upper surface of the light-emitting layer of each of the plurality of display elements is parallel to an upper surface of the substrate.

3. The display device of claim 1, wherein the light-emitting layer of each of the plurality of display elements is disposed between the opposite electrode and the common layer, and extends from the central portion of the pixel electrode to at least a portion of an inner surface of the opening.

4. The display device of claim 1, wherein an upper surface of the light-emitting layer is convex.

5. The display device of claim 4, wherein a width of a second region of the common layer in which the light-emitting layer is disposed is less than a width of the opening exposed by the pixel defining layer.

6. The display device of claim 4, wherein the first region extends to an inner surface of the opening.

7. The display device of claim 4, wherein the light-emitting layer is disposed between the common layer and the opposite electrode in the opening.

8. The display device of claim 1, wherein, in the first region, the common layer comprises a lower region to which each of protrusions are connected.

9. The display device of claim 8, wherein at least one of the protrusions has a rectangular cross-sectional shape.

10. The display device of claim 8, wherein a width of at least one of the protrusions at a first point is less than a width of at least one protrusion at a second point closer to the lower region than the first point in a thickness direction.

11. The display device of claim 8, wherein intervals at which the protrusions are spaced apart from one another are from 1 μm to 30 μm.

12. The display device of claim 1, the common layer further comprising a second region in which the light-emitting layer overlaps the common layer,
   wherein at least one of the first region and the second region is a hydrophobic region and the other is a hydrophilic region.

* * * * *